(12) United States Patent
Roberts et al.

(10) Patent No.: US 8,377,831 B2
(45) Date of Patent: Feb. 19, 2013

(54) SELECTION OF NANOPARTICLES USING $CO_2$-EXPANDED LIQUIDS

(75) Inventors: Christopher B. Roberts, Auburn, AL (US); Marshall Chandler McLeod, Hillsboro, OR (US); Madhu Anand, Auburn, AL (US)

(73) Assignee: Auburn University, Auburn, AL (US)

( * ) Notice: Subject to any disclaimer, the term of this patent is extended or adjusted under 35 U.S.C. 154(b) by 1034 days.

(21) Appl. No.: 12/082,189

(22) Filed: Apr. 8, 2008

(65) Prior Publication Data
US 2010/0323527 A1 Dec. 23, 2010

Related U.S. Application Data

(62) Division of application No. 11/237,601, filed on Sep. 27, 2005, now Pat. No. 7,384,879.

(60) Provisional application No. 60/613,249, filed on Sep. 27, 2004, provisional application No. 60/708,685, filed on Aug. 15, 2005.

(51) Int. Cl.
*H01L 21/31* (2006.01)

(52) U.S. Cl. ............... 438/758; 438/104; 427/452

(58) Field of Classification Search .......... 438/104, 438/758; 427/452
See application file for complete search history.

(56) References Cited

U.S. PATENT DOCUMENTS

| | | | |
|---|---|---|---|
| 5,360,554 A | 11/1994 | Sloan et al. | |
| 5,606,724 A * | 2/1997 | Wai et al. | 423/3 |
| 6,113,795 A | 9/2000 | Subramaniam et al. | |
| 6,958,308 B2 * | 10/2005 | Brown | 502/180 |
| 7,384,879 B2 | 6/2008 | Roberts et al. | |
| 7,744,923 B2 | 6/2010 | Rajewski et al. | |

FOREIGN PATENT DOCUMENTS

| | | |
|---|---|---|
| GB | 2322326 A | 8/1998 |
| WO | 9629998 | 10/1996 |
| WO | 03006223 A1 | 1/2003 |

OTHER PUBLICATIONS

DelRio et al., "The Effect of nanoparticles on rough surface adhesion," Journal of Applied Physics, 2006, vol. 99, pp. 104304-1 through 104304-9.
Adair et al., "Recent developments in the preparation and properties of nanometer-size spherical and platelet-shaped particles and composite particles," Materials Science and Engineering, 1998, R23, pp. 139-242.
Turkevich et al., "The color of colloidal gold," Journal of Colloid Science, 1954, vol. 9, Supp. 1, pp. 26-35.

(Continued)

*Primary Examiner* — David Vu
*Assistant Examiner* — Caleb Henry
(74) *Attorney, Agent, or Firm* — Haverstock & Owens LLP

(57) ABSTRACT

A method for size selection of nanostructures comprising utilizing a gas-expanded liquids (GEL) and controlled pressure to precipitate desired size populations of nanostructures, e.g., monodisperse. The GEL can comprise $CO_2$ antisolvent and an organic solvent. The method can be carried out in an apparatus comprising a first open vessel configured to allow movement of a liquid/particle solution to specific desired locations within the vessel, a second pressure vessel, a location controller for controlling location of the particles and solution within the first vessel, a inlet for addition of antisolvent to the first vessel, and a device for measuring the amount of antisolvent added. Also disclosed is a method for forming nanoparticle thin films comprising utilizing a GEL containing a substrate, pressurizing the solution to precipitate and deposit nanoparticles onto the substrate, removing the solvent thereby leaving a thin nanoparticle film, removing the solvent and antisolvent, and drying the film.

21 Claims, 23 Drawing Sheets

OTHER PUBLICATIONS

Frens, G., "Controlled Nucleation for the Regulation of the Particle Size in Monodisperse Gold Suspensions," Nature Physical Science, 1973, vol. 241, pp. 20-22.

Jana et al., "Seeding Growth for Size Control of 5-40 nm Diameter Gold Nanoparticles," Langmuir, 2001, vol. 17, pp. 6782-6786.

Liu et al., "Precise Seed-Mediated Growth and Size-Controlled Synthesis of Palladium Nanoparticles Using a Green Chemistry Approach," Langmuir, 2009, vol. 25, No. 12, pp. 7116-7128.

Fischer et al., "Photochemistry of Colloidal Semiconductors. 30. HPLC Investigation of Small CdS Particles.," Langmuir, 1989, vol. 5, pp. 429-432.

Jimenez et al., "HPLC of Monolayer-Protected Gold Nanoclusters," Analytical Chemistry, 2003, vol. 75, pp. 199-206.

Arnaud et al., "Size-selective separation of gold nanoparticles using isoelectric focusing electrophoresis (IEF)," Chemical Communications, 2005, pp. 787-788.

Hanauer et al., "Separation of Nanoparticles by Gel Electrophoresis According to Size and Shape," Nano Letters, 2007, vol. 7, No. 9, pp. 2881-2885.

Sweeney et al., "Rapid Purification and Size Separation of Gold Nanoparticles via Diafiltration," Journal of American Chemical Society, 2006, vol. 128, pp. 3190-3197.

Murray et al., "Synthesis and Characterization of Monodisperse Nanocrystals and Close-Packed Nanocrystal Assemblies," Annual Review of Materials Science, 2000, vol. 30, pp. 545-610.

Murray et al., "Synthesis and Characterization of Nearly Monodisperse CdE (E=S, Se, Te) Semiconductor Nanocrystallites," Journal of American Chemical Society, 1993, vol. 115, 8706-8715.

Eckert et al., "Tuning Solvents for Sustainable Technology," Industrial & Engineering Chemistry Research, 2000, vol. 39, pp. 4615-4621.

McLeod et al., "Precise and Rapid Size Selection and Targeted Deposition of Nanoparticle Populations Using CO2 Gas Expanded Liquids," Nano Letters, 2005, vol. 5., No. 3, pp. 461-465.

Anand et al., "Finely Controlled Size-Selective Precipitation and Separation of CdSe/ZnS Semiconductor Nanocrystals Using CO2-Gas-Expanded Liquids," Langmuir, 2007, vol. 23, No. 13, pp. 7338-7343.

Shah et al., "Size-Selective Dispersion of Dodecanethiol-Coated Nanocrystals in Liquid and Supercritical Ethane by Density Tuning," Journal of Physical Chemistry B, 2002, vol. 106, pp. 2545-2551.

Shah et al., "Role of Steric Stabilization on the Arrested Growth of Silver Nanocrystals in Supercritical Carbon Dioxide," Journal of Physical Chemistry B., 2002, vol. 106, pp. 12178-12185.

Kitchens et al., "Solvent Effects on the Growth and Steric Stabilization of Copper Metallic Nanoparticles in AOT Reverse Micelle Systems," Journal of Physical Chemistry B, 2003, vol. 107, pp. 11331-11338.

Sassiat et al., "Measurement of Diffusion Coefficients in Supercritical Carbon Dioxide and Correlation with the Equation of Wilke and Chang," Analytical Chemistry, 1987, vol. 59, pp. 1164-1170.

Brust et al., "Synthesis of Thiol-derivatised Gold Nanoparticles in a Two-phase Liquid-Liquid System," Journal of Chemical Society, Chemical Communications, 1994, pp. 801-802.

Sigman et al., "Metal Nanocrystal Superlattice Nulceation and Growth," Langmuir, 2004, vol. 20, pp. 978-983.

Jessop et al., "Gas-Expanded Liquids," Chemistry Review, 2007, vol. 107, pp. 2666-2694.

Anand et al., "Tunable Solvation Effects on the Size-Selective Fractionation of Metal Nanoparticles in CO2 Gas-Expanded Solvents," Journal of Physical Chemistry B, 2005, vol. 109, No. 48, pp. 22852-22859.

Anand et al., "Thermodynamic Analysis of Nanoparticle Size Selective Fractionation Using Gas-Expanded Liquids," Industrial & Engineering Chemistry Research, 2008, vol. 47, No. 3, pp. 553-559.

Kho et al., "Phase equilibria and thermophysical properties of carbon dioxide-expanded fluorinated solvents," Fluid Phase Equilibria, 2003, vol. 206, pp. 179-193.

Wilcoxon et al., "Photoluminescence from nanosize gold clusters," Journal of Chemical Physics, 1998, vol. 108, No. 21, pp. 9137-9143.

Maxey, N.B., "Transport and phase transfer catalysis in gas-expanded liquids," Georgia Institute of Technology, 2006.

Frank W. DelRio, Martin L. Dunn, Brad L. Boyce, Alex D. Corwin, and Maarten P. de Boer "The effect of nanoparticles on rough surface adhesion", 2006, pp. 104304-1-104304-9, American Instute of Physics.

Parag S. Shah et al., "Role of Steric Stabilization on the Arrested Growth of Silver Nanocrystals in Supercritical Carbon Dioxide", J. Phys. Chem B, vol. 106, No. 47, 2002, pp. 12178-12185.

* cited by examiner (A)

(B)

SELECTION OF NANOPARTICLES USING $CO_2$-EXPANDED LIQUIDS

CROSS REFERENCE TO RELATED APPLICATIONS

This application is a divisional of U.S. patent application Ser. No. 11/237,601, filed on Sep. 27, 2005 now U.S. Pat. No. 7,384,879, and entitled "SELECTION AND DEPOSITION OF NANOPARTICLES USING $CO_2$-EXPANDED LIQUIDS" which claims priority under 35 U.S.C. §119(e) of U.S. provisional applications Ser. Nos. 60/613,249, filed Sep. 27, 2004, and 60/708,685, filed Aug. 15, 2005, which are all hereby incorporated by reference in their entireties for all of their teachings.

ACKNOWLEDGEMENTS

This invention was made with government support under funding by the Department of Energy Basic Energy Sciences (DE-FG02-01ER15255) and the National Science Foundation (CTS-0207781). The government may have certain rights in the invention.

BACKGROUND

Nanoparticles are of significant current interest because of the novel properties which arise from the small size and high ratio of surface atoms. Nanoparticle based technologies take advantage of the fact that materials built from particles less than a critical length (Poole, C. P. J.; Owens, F. J. Introduction to Nanotechnology; Wiley-Interscience: Hoboken, 2003) display unique chemical and physical properties. Many nanoscale materials manifest unusual mechanical, chemical, magnetic, and optical properties which can be utilized in applications demanding improved or specialized performance. J. H. Adair, et al., *Mat'ls Sci. & Eng'g R- Reports,* 23, 139 (Aug. 20, 1998).

Not only do these unusual properties arise on the nanoscale, but they also often depend heavily on the size, shape, and composition of the nanoparticles. The size-dependent properties of nanoparticles allows one to engineer them to have specific functions, such as in catalysts (Pal, B.; Torimoto, T.; Iwasaki, K.; Shibayama, T.; Takahashi, H.; Ohtani, B. *J Phys. Chem. B* 2004, 108, 18670; Maillard, F.; Schreier, S.; Hanzlik, M.; Savinova, E. R.; Weinkauf, S.; Stimming, U. *Phys. Chem. Chem. Phys.* 2005, 7, 385; Arenz, M.; Mayrhofer, K. J. J.; Stamenkovic, V.; Blizanac, B. B.; Tomoyuki, T.; Ross, P. N.; Markovic, N. M. *J. Am. Chem. Soc'y* 2005, 127, 6819), quantum dots for optical properties (Nakashima, P. N. H.; Tsuzuki, T.; Johnson, A. W. S. *J. Appl. Phys.* 1999, 85, 1556; Mahamuni, S. *Solid State Physics, Proceedings of the DAE Solid State Physics Symposium,* 41st, Kurukshetra, India, Dec. 27-31, 1998 1999, 33), and medical applications (Bruchez, M., Jr.; Moronne, M.; Gin, P.; Weiss, S.; Alivisatos, A. P. *Science* 1998, 281, 2013). Thus, controlling the size and size distribution can provide opportunities to tune the special characteristics of nanomaterials for chosen applications.

The preparation of monodisperse metal particles is necessary to study the effects of size on their novel applications including size-dependent conduction of electrons in Ag nanoparticles (Drachev, V. P.; Buin, A. K.; Nakotte, H.; Shalaev, V. M. *Nano Lett.* 2004, 4, 1535) and size dependent oxidation with Au catalysts (Valden, M.; Lai, X.; Goodman, D. W. *Science* (Washington, D. C.) 1998, 281, 1647; Haruta, M. *Catalysis Today* 1997, 36, 153). Moreover, monodisperse nanoparticles are also critical in the production of high quality ordered arrays and ordered thin films. Stowell, C.; Korgel, B. A. *Nano Lett.* 2001, 1, 595; Shah, P. S.; Sigman, M. B., Jr.; Stowell, C. A.; Lim, K. T.; Johnston, K. P.; Korgel, B. A. *Advanced Materials* (Weinheim, Germany) 2003, 15, 971; Shah, P. S.; Novick, B. J.; Hwang, H. S.; Lim, K. T.; Carbonell, R. G.; Johnston, K. P.; Korgel, B. A. *Nano Lett.* 2003, 3, 1671; Korgel, B. A.; Fullam, S.; Connolly, S.; Fitzmaurice, D. *J. Phys. Chem. B* 1998, 102, 8379.

However, despite the widespread interest and investigation of ligand-stabilized nanoparticles over the last decade, relatively little improvement has been made to the time-consuming and solvent-intensive techniques employed for isolating monodisperse particle populations of ligand-stabilized particles. C. H. Fischer, H. Weller, L. Katsikas, A. Henglein, *Langmuir* 5, 429 (1989); T. Vossmeyer, et al., *J. Phys. Chem.* 98, 7665 (1994).

There are numerous methods to produce metal nanoparticles, including simple solution-based techniques such as reverse micelle synthesis (Cason, J. P.; Roberts, C. B. *J. Phys. Chem. B* 2000, 104, 1217; Kitchens, C. L.; McLeod, M. C.; Roberts, C. B. *J. Phys. Chem. B* 2003, 107, 11331) and two-phase arrested precipitation methods (Brust, M.; Walker, M.; Bethell, D.; Schiffrin, D. J.; Whyman, R. *J. Chem. Soc'y, Chem. Comm.* 1994, 801). While these particular solution-based techniques are attractive due to their simplicity, they often result in the synthesis of particle sizes with a wide size range (e.g., 1 to 20 nm). Therefore, post-synthesis processing is required to further refine the size distribution to a desired narrow monodisperse range. A major current thrust of research is now being placed on post-synthesis particle manipulation for application to fields such as catalysis, optical systems, electronic devices, and sensors. Brust, M.; Keily, C. J., *Colloid. Surface. A* 2002, 202, 175-186; Collier, C.P.; Vossmeyer, T.; Heath, J. R. *Annu. Rev. Phys. Chem.* 1998, 49, 371-404.

A variety of post-synthesis techniques have been developed to narrow size distributions including the use of liquid antisolvents (Korgel, B. A.; Fullam, S.; Connolly, S.; Fitzmaurice, D. *J. Phys. Chem. B* 1998, 102, 8379; Murray, C. B.; Norris, D. J.; Bawendi, M. G. *J. Amer. Chem. Soc'y* 1993, 115, 8706; Sigman, M. B., Jr.; Saunders, A. E.; Korgel, B. A. *Langmuir* 2004, 20, 978) to selectively control precipitation, isoelectric focusing electrophoresis (IEF) (Arnaud, I.; Abid, J.-P.; Roussel, C.; Girault, H. H. *Chem. Comm.* (Cambridge, United Kingdom) 2005, 787), and chromatography techniques (Siebrands, T.; Giersig, M.; Mulvaney, P.; Fischer, C. H. *Langmuir* 1993, 9, 2297), to name a few. As an example, Sigman et al. (Sigman, M. B., Jr.; Saunders, A. E.; Korgel, B. A. *Langmuir* 2004, 20, 978) used ethanol as an antisolvent and centrifugation to size-selectively precipitate and separate a polydisperse dispersion of silver nanoparticles capped with dodecanethiol ligands into monodisperse particle fractions.

In these antisolvent nanoparticle precipitation techniques, ligand-capped particles are first dispersed in solution where the interaction between the solvent and the ligand tails provides enough repulsive force to overcome the inherent van der Waals attraction between the particles that would otherwise result in agglomeration and precipitation. Through the addition of an antisolvent, the resultant poorer solvent mixture interacts less with the ligand tails than the pure solvent did, thereby rendering a lesser ability of the solvent/antisolvent mixture to disperse the particles. Larger particles possess greater interparticle van der Waals attractions and, therefore, precipitate first upon worsening solvent conditions followed by subsequent precipitation of the smaller-sized particles with further addition of antisolvent. Applying centrifugation then provides external force to accelerate the precipitation process. Repetition of this antisolvent/centrifugation method on the separated particles can result in narrow particle size distributions, σ<5%; however, the whole process is both solvent and time intensive. It is also difficult to obtain an a priori desired particle size through this separation process in a repeatable manner simply by changing the composition of the liquid antisolvent/solvent pair.

Research in the area of compressed and supercritical fluid solvents has shown that the pressure- and temperature-tunable solvent properties in these systems provides a means to control the size of nanoparticles that can be synthesized and/or dispersed. Shah, P. S.; Hanrath, T.; Johnston, K. P.; Korgel, B. A. *J. Phys. Chem. B* 2004, 108, 9574; Shah, P. S.; Husain, S.; Johnston, K. P.; Korgel, B. A. *J. Phys. Chem. B* 2002, 106, 12178; Kitchens, C. L.; Roberts, C. B. *Indus. & Eng'g Chem. Res.* 2004, 43, 6070; Clarke, N. Z.; Waters, C.; Johnson, K.A.; Satherley, J.; Schiffrin, D. J. *Langmuir* 2001, 17, 6048. Shah et al. demonstrated the size-selective dispersion of dodecanethiol-coated nanoparticles in supercritical ethane by density tuning. Shah, P. S.; Holmes, J. D.; Johnston, K. P.; Korgel, B. A. *J. Phys. Chem. B* 2002, 106, 2545. They illustrated that with the change in solvent density, the dispersable particle size could be adjusted where the largest particle sizes were dispersed at the highest pressure. However, ethane is a feeble solvent and very high pressures of around 414 bar were required to disperse particles of only 3.7 nm in size. Efficient solvent-based separation techniques for a wide range of nanoparticle sizes would require better solvent strength than these supercritical solvents are able to provide at significantly lower pressures.

To overcome these limitations and to provide improved control over size selective precipitation, we developed a method of the current invention which utilizes gas expanded liquids (GELs). Among their many applications, GELs have been used as tunable reaction media (Wei, M.; Musie, G. T.; Busch, D. H.; Subramaniam, B. *J. Amer. Chem. Soc'y* 2002, 124, 2513; Thomas, C. A.; Bonilla, R. J.; Huang, Y.; Jessop, P. G. *Can. J. Chem.* 2001, 79, 719; Xie, X.; Liotta, C. L.; Eckert, C. A. *Ind'l & Eng'g Chem. Res.* 2004, 43, 7907), as adjustable solvents for separations (Gallagher, P. M.; Coffey, M. P.; Krukonis, V. J.; Klasutis, N. *ACS Symp. Series* 1989, 406, 334; Eckert, C. A.; Bush, D.; Brown, J. S.; Liotta, C. L. *Ind'l & Eng'g Chem. Research* 2000, 39, 4615; Chen, J.; Zhang, J.; Liu, D.; Liu, Z.; Han, B.; Yang, G. *Coll. and Surfaces, B: Biointerfaces* 2004, 33, 33; Xie, X.; Brown, J. S.; Joseph, P. J.; Liotta, C. L.; Eckert, C. A. *Chem. Comm.* (Cambridge, United Kingdom) 2002, 1156), in the switching of fluorous compound solubilities (Jessop, P. G.; Olmstead, M. M.; Ablan, C. D.; Grabenauer, M.; Sheppard, D.; Eckert, C. A.; Liotta, C. L. *Inorg. Chem.y* 2002, 41, 3463), and in gas antisolvent (GAS) precipitation techniques for organic and polymer microparticle formation (Randolph, T. W.; Randolph, A. D.; Mebes, M.; Yeung, S. *Biotech. Prog.* 1993, 9, 429).

Gas expanded liquid systems provide a wide range of solvent properties (from liquid-like to gas-like) that are widely tunable with simple adjustments in gas pressure thereby providing further opportunity for nanoparticle precipitation and separation. McLeod, M. C.; Anand, M.; Kitchens, C. L.; Roberts, C. B. *Nano Lett.* 2005, 5, 461. For example, Han and coworkers precipitated nanoparticles from Aerosol OT (sodium bis(2-ethylhexyl)sulfosuccinate) (AOT) reverse micelles in liquid isooctane using pressurized $CO_2$ as an antisolvent. Liu, D.; Zhang, J.; Han, B.; Chen, J.; Li, Z.; Shen, D.; Yang, G. *Coll. and Surf., A: Physicochem. Eng'g Aspects* 2003, 227, 45; Zhang, J.; Han, B.; Liu, J.; Zhang, X.; He, J.; Liu, Z.; Jiang, T.; Yang, G. *Chemistry—A European Journal* 2002, 8, 3879; Zhang, J.; Han, B.; Liu, J.; Zhang, X.; Yang, G.; Zhao, H. *J. Supercrit. Fluids* 2004, 30, 89.

Full utilization of nanoparticles for various applications requires the ability to effectively process and accurately maneuver particles onto surfaces or support structures. This encompasses areas ranging from particle size selection to accurate manipulation of particles onto surfaces such as assembled nanoparticle thin films, arrays, and superstructures. This is often performed by evaporating a liquid solution containing dispersed solvated/stabilized nanoparticles to leave ordered lattice structures. Collier, et al. 1998; Sigman, M.B., Jr.; Saunders, A. E.; Korgel, B. A. *Langmuir* 2004, 20, 978-983. However, wetting effects and surface tensions inherent with liquid/vapor interfaces can lead to random film defects such as interconnected lattices and areas of inconsistent particle deposition and assembly.

Preparation of particles for surface deposition is commonly performed using wet chemical methods such as arrested precipitation techniques (Sigman, et al., 2004; Brust, M., Walker, M., Bethell, D., Schiffrin, D. J., Whyman, R. J. *Chem. Soc. Chem. Comm.* 1994, 801-802) or reverse micelle methods (Petit, C., Lixon, P., Pileni, M. P. *J. Phys. Chem.* 1993, 97, 12974-12983). After particle synthesis, the particles are generally separated and cleaned from the synthesis solution using a liquid antisolvent to precipitate the particles. Nanoparticle dispersal in a solvent arises from the solvation of ligand tails attached to the nanoparticles. When these tails are well solvated, the particles can be effectively dispersed in the solvent. Similarly, addition of an antisolvent with regard to the ligand tails functions to lower the dispersibility of the ligand-coated nanoparticles.

Han and co-workers (Liu, D., Zhang, J., Han, B., Chen, J., Li, Z., Shen, D., Yang, G. *Colloid. Surface. A* 2003, 227, 45-48; Zhang, J., Han, B., Liu, J., Zhang, X., Liu, Z., He, J. *Chem. Commun.* 2001, 2724-2725; Zhang, J., Han, B., Liu, J., Zhang, X., He, J., Liu, Z., Jiang, T., Yang, G. *Chem.-Eur. J.* 2002, 8, 3879-3883; Zhang, J., Xiao, M., Liu, Z., Han, B., Jiang, T., He, J., Yang, G. *J. Colloid Interf. Sci.* 2004, 273, 160-164) have shown the ability to use $CO_2$ as a gas antisolvent to recover nanoparticles of zinc sulfide, silver, and titanium dioxide from reverse micelles in isooctane. Such a technique is feasible because compressed gases such as $CO_2$ can dissolve into organic liquids and expand the liquid volume significantly while also altering the liquids' solvation characteristics. Kordikowski, A., Schenk, A. P., Van Nielen, R. M., Peters, C. J. *J. Supercrit. Fluids* 1995, 8, 205-216. These liquid solutions are referred to as gas-expanded liquids and have been used in gas antisolvent (GAS) techniques for the precipitation of organic compounds from organic solutions (Gallagher, P. S., Coffey, M. P., Krukonis, V. J., Klasutis, N., In *Supercritical Fluid Science and Technology*, Johnston, K. P., Penninger, M. L., Eds., 1989, Vol. 406, pp. 334-354), for reaction tuning (Thomas, C. A., Bonilla, R. J., Huang, Y., Jessop, P. G. *Canadian J. of Chem.* 2001, 79, 719-724; Wei, M., Musie Ghezai, T., Busch Daryle, H., Subramaniam, B. J. *J. Am. Chem. Soc.* 2002, 124, 2513-2517), and for the switching of fluorous compound solubility in organic solvents (Jessop, P. G., Olmstead, M. M., Ablan, C. D., Grabenauer, M., Sheppard, D., Eckert, C., A. Liotta, C. L. *Inorg. Chem.* 2002, 41, 3463-3468), among others. As the $CO_2$ is increasingly added to the organic solution, any solutes present which are not solvated by the gas-expanded liquid are forced to precipitate. Xie, X., Brown, J. S., Joseph, P. J., Liotta, C. L., Eckert, C. A. *Chem. Commun.* 2002, 1156-1157; Reverchon, E. *J. Supercrit. Fluids* 1999, 15, 1-21.

In some cases the capillary forces present at the liquid/vapor interface of a drying liquid can function advantageously to organize particles into ordered nanocrystal superlattices or to position nanosized structures on a substrate. Lin, X. M.; Jaeger, H. M.; Sorensen, C. M.; Klabunde, K. J. *J. Phys. Chem. B* 2001, 105, 3353-3357; Korgel, B. A., Fitzmaurice, D. *Phys. Rev. Lett.* 1998, 80, 3531-3534; Cui, Y., Bjoerk, M. T., Liddle, J. A., Soennichesen, C., Boussert, B., Alivisatos, A. P. *Nano Lett.* 2004, 4, 1093-1098. For example, Cui et al., 2004, recently utilized the capillary force at the solution interface as a means of positioning sub-10-nm-size particles and tetrapod nanostructures upon a lithographically patterned surface.

However, the dewetting process can give rise to undesirable features in the deposition of nanoparticle films over large areas. Capillary forces and high surface tensions at the liquid/vapor interface commonly lead to nanoparticle deposition features such as isolated islands, percolating domains, locally high particle concentrations, ring-like structures, and uneven surface coverage. Lin, et al. 2001; Korgel, et al. 1998; Ohara, P. C., Gelbert, W. M. *Langmuir* 1998, 14, 3418-3424; Ohara, P. C., Leff, D. V., Heath, J. R., Gelbert, W. M. *Phys. Rev. Lett.* 1995, 75, 3466-3469; Motte, L., Billoudet, F., Lacaze, E., Douin, J., Pileni, M. P. *J. Phys. Chem. B* 1997, 101, 138-144; Giersig, M., Mulvaney, P. *Langmuir* 1993, 9, 3408-3413. This phenomenon is effectively demonstrated by work done by Ohara et al., 1998, which showed that as holes open in the surface of a thin solvent film during evaporation, the dewetting liquid interface pulls the particles along the rim of the opening hole. The particles eventually become pinned to the surface and the liquid interface moves over the particles, leaving behind ring-like nanoparticle arrays.

In order to overcome surface wetting instabilities, Shah et al. (Shah, P. S., Novick, B. J., Hwang, H. S., Lim, K. T., Carbonell, R. G., Johnston, K. P., Korgel, B. A. *Nano Lett.* 2003, 3, 1671-1675) recently used evaporating liquid carbon dioxide, rather than organic liquids, as the medium for particle deposition. Since $CO_2$ does not exhibit dewetting instabilities, it was used to study the kinetics of nanocrystal monolayer formation when fluorooctyl methacrylate thiol-coated particles were deposited at different $CO_2$ evaporation rates. The fluorooctyl methacrylate thiols were required to induce dispersal of the gold nanoparticles in $CO_2$. Unfortunately, it was reported that, even with the $CO_2$-philic fluorinated ligands, the concentration of particles in liquid $CO_2$ was limited because of their low dispersibility in liquid $CO_2$.

Despite the inability of $CO_2$ to stabilize and easily disperse nanoparticles, it is still an excellent process solvent for nanomaterial features due to its low viscosity and low surface tension. Johnston, K. P., Shah, P. S. *Science* 2004, 303, 482-483; Shah, P. S., Hanrath, T., Johnston, K. P., Korgel, B. A. *Phys. Chem. B* 2004, 108, 9571-9587; Holmes, J. D., Lyons, D. M. Ziegler, K. J. *Chem.-Eur. J.* 2003, 9, 2144-2150; Blackburn, J. M., Long, D. P., Cabanas, A., Watkins, J. J. *Science* 2001, 294, 141-145. The work of Shah et al., 2003, advantageously used the properties of liquid $CO_2$ to form gold nanocrystal monolayers.

Further improvement of the properties of $CO_2$ as a process solvent can be achieved by operation under supercritical fluid conditions, where it possesses low interfacial tensions, high diffusivities, and superior surface wetting properties. Supercritical $CO_2$ is an ideal solvent for processing these nanoparticle films due to its low interfacial tensions, excellent wetting of surfaces, and the avoidance of phase transitions when transitioning from liquid-like densities to vapor-like densities. In addition, $CO_2$ is non-toxic, non-flammable, and inexpensive.

SUMMARY OF THE INVENTION

Described herein are methods for size selection of nanostructures and for forming nanoparticle thin films. In particular, monodisperse populations of nanostructures can be prepared and nanoparticles can be deposited as a thin film. Further, an apparatus for performing these methods is disclosed. Additionally, articles and compositions comprising these nanoparticle thin films are disclosed.

In one aspect, described herein is a precipitation apparatus for physical separation of different sized nanostructures from a polydisperse solution comprising a) a first open vessel configured to allow movement of a liquid/particle solution to specific desired locations within the first vessel, b) a second pressure vessel, c) a location controller for controlling location of the particles and solution within the first vessel, d) an inlet for addition of antisolvent to the first vessel, and e) a device for measuring amount of antisolvent added. The first vessel can be an open-ended tube with concentric spiral grooves placed therein and traversing from end to end. The location of liquid/particles within the first vessel can be controlled by rotation of the first vessel. The location controller can be a rod connected to the first vessel extending through the second vessel for rotating the first vessel.

In another aspect, described herein is a method for size selection of nanostructures, e.g., nanoparticles. The method can comprise a) loading a solution of dispersed nanostructures and a solvent into a vessel; b) adding gaseous antisolvent, e.g., $CO_2$, to the vessel containing the solution to an initial pressure, $P_0$, effective to form the solution into a gas-expanded liquid (GEL); c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, $F_i$, of nanostructures onto a surface; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and displaced wherein x=the number of size fractions of nanostructures desired. The method can further comprise collecting each displaced size fraction, $F_i$. The nanostructures can be, for example, ligand-coated, ligand stabilized and/or sterically stabilized. The pressure increment, $\Delta P_i$, can be chosen based on a desired degree of polydispersity for the nanostructures within the corresponding size fraction, $F_i$. The pressure increments, $\Delta P_{i=1\ to\ x}$, can be each chosen to achieve a desired level of particle dispersity for the corresponding size fraction, $F_{i=1\ to\ x}$.

In yet another aspect, described herein is a method for fractionating multiple monodisperse populations of nanostructures from a single solution comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, $F_i$, of nanostructures; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and separated wherein x=the number of size fractions of nanostructures desired and wherein $\Delta P_i$=the pressure increment.

In a further aspect, described herein is a method for selecting mean particle size and standard deviation of nanostructures comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, $F_i$, of nanostructures; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and separated wherein x=the number of size fractions of nanostructures desired.

In another aspect, described herein is a method for choosing the mean size of precipitated nanostructures in a nanoparticle population comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, $F_i$, of nanostructures; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and separated wherein x=the number of size fractions of nanostructures desired and wherein the mean size of precipitated nanostructures corresponds to the pressure $P_i$.

In another aspect, described herein is an improved method for size separation of nanostructures comprising a) gas expanding a solution of organic liquid and dispersed nanostructures by pressurizing $CO_2$ over the solution in a vessel to form a gas-expanded liquid (GEL), b) providing an increased pressure, $P_i$, of $CO_2$ in the vessel to select the fraction of $CO_2$ comprising the GEL thereby tuning the solubility between the solvent strength of the solvent and the liquid $CO_2$ to precipitate the nanostructures no longer soluble in the GEL due to the change in pressure, c) separating the precipitated nanostructures from the nanostructures remaining dispersed in the gas-expanded liquid; and d) repeating steps b) to c) until all desired sizes of nanostructures are precipitated and separated.

In an additional aspect, described herein is a method for forming nanoparticle thin films comprising a) providing nanoparticles; b) providing a substrate; c) forming a solution of the nanoparticles dispersed in a liquid solvent wherein the solvent is expandable by a gaseous antisolvent and the gaseous antisolvent is soluble in the liquid solvent and wherein the solution contains the substrate; d) adding a first amount of the gaseous antisolvent to a vessel containing the solution, to pressurize and expand the solution in the vessel, at a rate effective and to a final pressure necessary, to precipitate and deposit the nanoparticles onto the substrate; e) removing the solvent thereby leaving a thin nanoparticle film on the substrate; f) adding a second amount of gaseous antisolvent to the solution effective to mix with and dissolve the solvent away from the nanoparticle coated substrate; g) raising pressure and/or temperature conditions to produce supercritical gaseous antisolvent; and h) maintaining the supercritical conditions for a period of time sufficient to dissolve the solvent and supercritically dry the nanoparticle film.

In a still further aspect, described herein is a thin film of nanoparticles on a substrate comprising a film of nanoparticles with at least about 50% surface coverage of the substrate.

In another aspect, described herein is an improved nanoparticle thin film comprising a more uniform and greater surface coverage and lower defect film of nanoparticles relative to the same nanoparticle thin films deposited from evaporated liquid solvents.

In another aspect, described herein is a device, article, or catalyst comprising a nanoparticle thin film of the invention.

Disclosed herein is an environmentally-friendly, inexpensive, rapid, and efficient process for size selective fractionation of polydisperse metal nanoparticle dispersions into multiple narrow size populations. The dispersibility of ligand-stabilized metal nanoparticles is controlled by altering the ligand-solvent interaction (solvation) by the addition of carbon dioxide ($CO_2$) gas as an antisolvent, thereby tailoring the bulk solvent strength. This is accomplished by adjusting the $CO_2$ pressure over the liquid, resulting in a simple means to tune the nanoparticle precipitation by size. Also disclosed is the influence of various factors on the size separation process, such as the types of metal, ligand, and solvent, as well as the use of recursive fractionation and the time allowed for settling during each fractionation step.

The pressure range required for the precipitation process was found to be the same for each tested metal, e.g., silver and gold, particle capped with, e.g., dodecanethiol, ligand. A change in ligand or solvent length had an effect on the interaction between the solvent and the ligands and, therefore, the pressure range required for precipitation. Stronger interactions between solvent and ligands require greater $CO_2$ pressure to precipitate the particles.

Temperature is another variable which influences these interactions and can affect the stabilization of the nanoparticles in the solvent. Recursive fractionation for a given system within a particular pressure range (solvent strength) further reduces the polydispersity of the fraction obtained within that pressure range.

Specifically, the invention utilizes the highly tunable solvent properties of organic/$CO_2$ solvent mixtures to selectively size-separate dispersions of polydisperse nanoparticles, e.g., 2 to 12 nm, into monodisperse fractions, e.g., ±2 nm. In addition to providing efficient separation of the particles, this process also allows all of the solvent and antisolvent to be recovered, thereby rendering it a "green" solvent process.

Deposition of nanoparticles into uniform, wide area thin films using $CO_2$ as an antisolvent is also disclosed. Ligand-stabilized metal, e.g., silver, particles were controllably precipitated from organic solvents by pressurizing and expanding the solution with carbon dioxide. Subsequent addition of carbon dioxide as a dense supercritical fluid provided for removal of the organic solvent while avoiding the surface tensions common to evaporating solvents that are detrimental to nanoscale assemblies and structures. This $CO_2$-expanded liquid particle deposition technique allows for the targeted deposition of particles and results in more uniform and lower defect metal nanoparticle thin films than is provided by conventional solvent evaporation techniques.

Additional advantages will be set forth in part in the description which follows, and in part will be obvious from the description, or may be learned by practice of the aspects described below. The advantages described below will be realized and attained by means of the elements and combinations particularly pointed out in the appended claims. It is to be understood that both the foregoing general description and the following detailed description are exemplary and explanatory only and are not restrictive.

BRIEF DESCRIPTION OF THE DRAWINGS

The accompanying drawings, which are incorporated in and constitute a part of this specification, illustrate several aspects described below. Like numbers represent the same elements throughout the figures.

DETAILED DESCRIPTION

Figure 1:
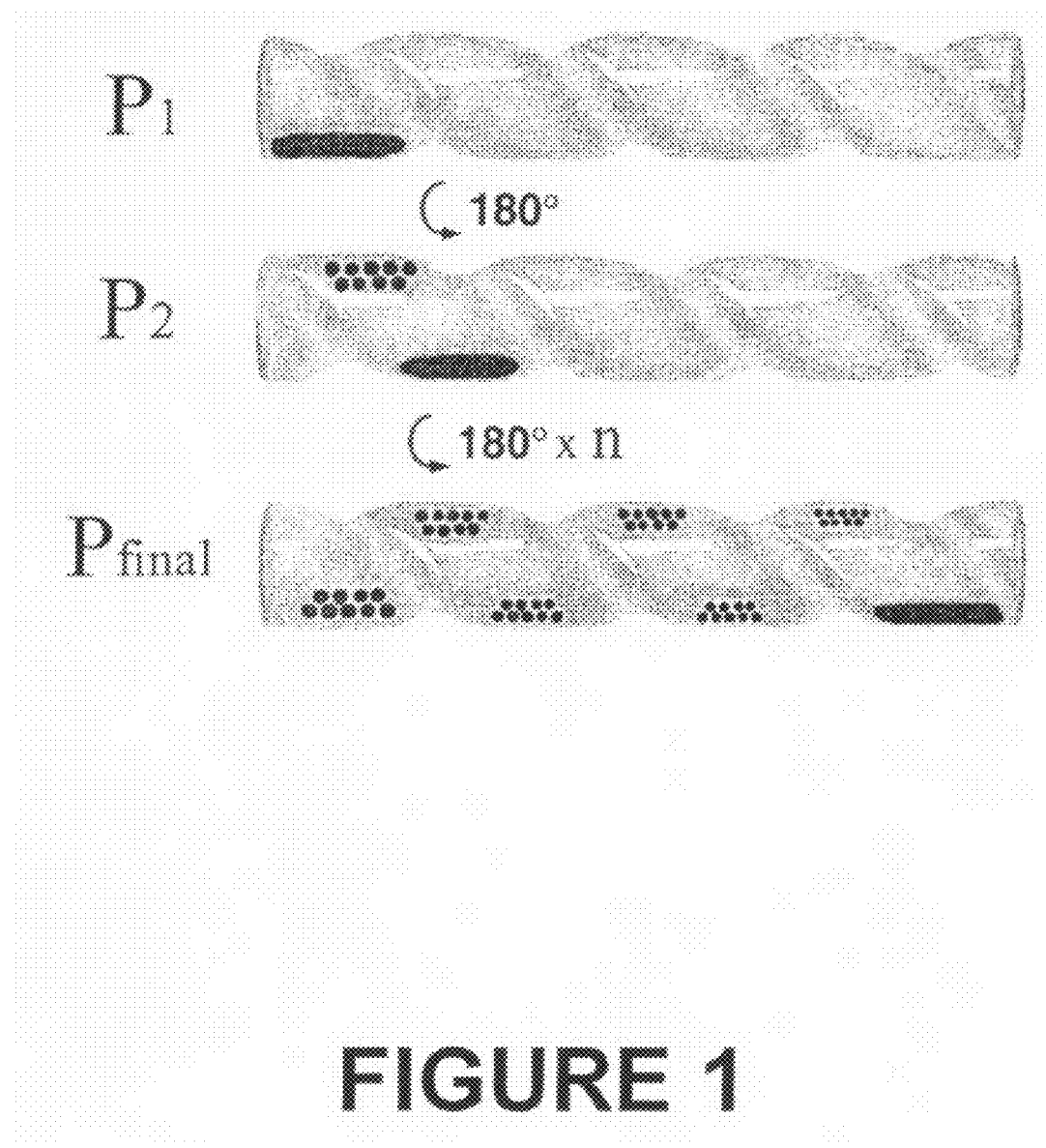
FIG. 1 shows an example nanoparticle size selection apparatus of the invention depicting recursive pressurization of organic liquid with $CO_2$ followed by 180° tube rotation to achieve multiple size selected populations of nanoparticles. The high-pressure vessel which enclosed the glass tube is not shown in the figure.

Before the present compounds, compositions, articles, devices, and/or methods are disclosed and described, it is to be understood that the aspects described below are not limited to specific synthetic methods; specific methods as such may, of course, vary. It is also to be understood that the terminology used herein is for the purpose of describing particular aspects only and is not intended to be limiting.

In this specification and in the claims which follow, reference will be made to a number of terms which shall be defined to have the following meanings:

It must be noted that, as used in the specification and the appended claims, the singular forms "a," "an," and "the" include plural referents unless the context clearly dictates otherwise. Thus, for example, reference to "an antisolvent" includes mixtures of antisolvents, reference to "a ligand" includes mixtures of two or more such ligands, and the like.

"Optional" or "optionally" means that the subsequently described event or circumstance can or cannot occur, and that the description includes instances where the event or circumstance occurs and instances where it does not.

Ranges may be expressed herein as from "about" one particular value, and/or to "about" another particular value. When such a range is expressed, another aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

References in the specification and concluding claims to parts by weight, of a particular element or component in a composition or article, denotes the weight relationship between the element or component and any other elements or components in the composition or article for which a part by weight is expressed. Thus, in a compound containing 2 parts by weight of component X and 5 parts by weight component Y, X and Y are present at a weight ratio of 2:5, and are present in such ratio regardless of whether additional components are contained in the compound.

A weight percent of a component, unless specifically stated to the contrary, is based on the total weight of the formulation or composition in which the component is included.

Monodisperse particles, as used herein, refers to samples that have a standard deviation, $\sigma$, of diameter less than 10%.

Size Selection

A new method is demonstrated for the precise and rapid size selection of ligand-coated metallic nanoparticles from organic solution using $CO_2$ as a superior antisolvent to traditional liquid antisolvents. The employed process allows multiple monodisperse populations of nanoparticles to be fractionated within a single solution through simple adjustments in pressure. It, therefore, eliminates major difficulties associated with liquid solvent/anti-solvent size selection which are both time and solvent intensive. Mean particle size and standard deviation can also be predetermined by simply choosing the amount of $CO_2$ pressurization.

We have developed a greatly improved method for obtaining monodisperse particle populations from an initially polydisperse solution of ligand capped metal nanoparticles. Our improved methodology utilizes gaseous $CO_2$ as the antisolvent to induce an organic/$CO_2$ liquid mixture often termed a gas-expanded liquid (C. A. Eckert, D. Bush, J. S. Brown, C. L. Liotta, *Ind'l & Eng'g Chem. Res*. 39, 4615 (2000)) and, in so doing, allows for pressure tunable particle separation. The benefits of this implementation are four-fold: 1) The use of $CO_2$ eliminates large quantities of organic liquid solvents and antisolvents required in the traditional technique (however, higher pressures are required than normal liquid based techniques). 2) By simply choosing the amount of $CO_2$ pressurization, the mean size of precipitated particles can be easily predetermined. 3) The degree of polydispersity can be determined simply by the pressure increment of fractionation. And lastly, 4) through creative implementation, multiple monodisperse particle populations can be rapidly fractionated by adjusting only the $CO_2$ pressure and liquid location on a surface.

Monodisperse particle populations are required in order to identify individual particle properties from the bulk population as well as to elucidate size dependent properties. Once the known characteristics and behavior of defined particle populations are known, the particles can be applied to specific needs. Two often cited examples of nanoscale size dependent behavior are the fluorescence of semiconductor nanoparticles (quantum dots) when exposed to ultraviolet light and the unusual ultraviolet-visible absorbances of many metallic nanoparticles. M. Bruchez, Jr., M. Moronne, P. Gin, S. Weiss, A. P. Alivisatos, *Science* 281, 2013 (1998); J. A. Creighton, D. G. Eadon, *J. Chem. Soc'y, Faraday Transactions* 87, 3881 (1991). For the case of quantum dots, narrowly sized populations are currently finding application as size tunable fluorescent probes in biological staining and diagnostics. M. Bruchez, Jr., et al., *Science* 281, 2013 (1998).

The most commonly used technique for particle size selection uses liquid solvent/anti-solvent pairs combined with centrifugation to selectively precipitate the largest particles from solution. C. B. Murray, D. J. Norris, M. G. Bawendi, *J. Amer. Chem. Soc'y* 115, 8706 (1993). The method takes advantage of the inherent van der Waals attractions between particles which lead to the aggregation and subsequent precipitation of unstabilized particles from solution. Capping ligands which attach to the particle surface are often used to provide a barrier against particle aggregation and growth, but they also facilitate particle dispersal in liquid solvents which solvate the tails. The solvent interaction with the capping ligands attached to the particle then determines particle dispersibility. Assuming a good solvent for the ligands, solvation of the capping agent tails provides a repulsive force of sufficient strength and range to overcome the interparticle attraction. In a poor solvent, the ligands are not sufficiently solvated by the solvent and are, thus, unable to prevent the interparticle attraction, agglomeration, and precipitation. Hence, gradual addition of antisolvent to the dispersed particle solution can induce a gradual reduction in solubility for the particles in solution. Since large particles possess greater interparticle van der Waals attractions, they precipitate first upon worsening solvent conditions. Centrifuging the particle solution can then accelerate precipitation of the larger particles from solution. Repetition of the size-selection procedure to the recovered particles can successfully narrow the particle distribution to less than 5% standard deviation ($\sigma$<5%). C. B. Murray, et al., *J. Amer. Chem. Soc'y* 115, 8706 (1993). While monodispersity implies that nanoparticles be identical in size and shape, this definition is often relaxed to allow for a 5% or even a 10% standard deviation since many interesting behaviors such as crystalline nanoparticle organization into nanoparticle arrays and crystalline lattice superstructures occur at this level of size similarity. M. B. Sigman, Jr., A. E. Saunders, B. A. Korgel, *Langmuir* 20, 978 (2004); C. B. Murray, C. R. Kagan, M. G. Bawendi, *Ann'l Rev. Mat. Sci.* 30, 545 (2000); C. P. Collier, T. Vossmeyer, J. R. Heath, *Ann. Rev. Phys. Chem.* 49, 371 (1998). Fractions of successively smaller sizes can be obtained by repeating the process with the remaining supernatant (i.e., recursive processing). In addition to being time consuming and solvent intensive, the technique can be somewhat subjective as it is often based on the observed opalescence of the solution upon antisolvent addition. T. Vossmeyer, et al., *J. Phys. Chem.* 98, 7665 (1994); C. B. Murray, D. J. Norris, M. G. Bawendi, *J. Amer. Chem. Soc'y* 115, 8706 (1993). Therefore, obtaining similar size fractions can be difficult if the particles are fractionated separately. Otherwise, solutions must be mixed in careful quantities to achieve desirable solvent conditions. Evidently, recursive application of this technique to obtain multiple monodisperse populations of different mean size is; by nature, time and solvent intensive. T. Vossmeyer et al., *J. Phys. Chem.* 98, 7665 (1994). In addition to solvent/antisolvent size narrowing, size exclusion chromatography has also been utilized for size selection but, unfortunately, throughput with this method is limited. C. H. Fischer, H. Weller, L. Katsikas, A. Henglein, *Langmuir* 5, 429 (1989); W. L. Wilson, P. F. Szajowski, L. E. Brus, *Science* 262, 1242 (1993).

Our method for improved size separation of nanoparticles relies on the phenomenon whereby gaseous $CO_2$ pressurized over an organic liquid can expand the liquid volume several fold. J. C. de la Fuente Badilla, C. J. Peters, J. de Swaan Arons, *J. Supercrit. Fluids* 17, 13 (2000); P. S. Gallagher, M. P. Coffey, V. J. Krukonis, N. Klasutis, in *Supercritical Fluid Science and Technology* K. P. Johnston, M. L. Penninger, Eds. (1989), vol. 406, pp. 334; A. Kordikowski, A. P. Schenk, R. M. Van Nielen, C. J. Peters, *J. Supercrit. Fluids* 8, 205 (1995). For this reason the resulting liquid $CO_2$/organic mixture is referred to as a gas-expanded liquid (GEL). By simply changing the pressure of gaseous $CO_2$, the fraction of $CO_2$ liquid comprising the GEL can be altered and, accordingly, the solubility can be tuned between the solvent strength of the initial solvent and that of liquid carbon dioxide. For particle dispersability, a threshold strength of interaction between the solvent mixture and ligand tails is necessary to sterically stabilize particles of a given size. C. L. Kitchens, C. B. Roberts, *Ind'l & Eng'g Chem. Res.*, ACS ASAP; P. S. Shah, T. Hanrath, K. P. Johnston, B. A. Korgel, *J. Phys. Chem. B* 108, 9574 (2004). By adding $CO_2$ to (pressurizing) the solution, the solvent strength diminishes to below the threshold interaction value for that particle size, at which point the correspondingly sized particles precipitate. An especially attractive feature of the GEL for particle separation is that the pressures required are relative low (typically below 800 psi) whereas the pressure tunable solubility offered by supercritical fluids requires pressures exceeding the fluid's critical point. Moreover, it has been shown that in order to attain dispersability of small particles in supercritical fluids, pressures must far exceed the critical pressure with further elevations in pressure necessary to disperse larger particles. C. L. Kitchens, C. B. Roberts, *Ind'l & Eng'g Chem. Res.*, ACS ASAP; P. S. Shah, T. Hanrath, K. P. Johnston, B. A. Korgel, *J. Phys. Chem. B* 108, 9574 (2004). For example, small 1.8 nm diameter gold crystals can be dispersed at 2000 psi in supercritical ethane, while 6000 psi is required to disperse 4.2 nm particles. P. S. Shah, T. Hanrath, K. P. Johnston, B. A. Korgel, *J. Phys. Chem. B* 108, 9574 (2004). For the case of supercritical $CO_2$, which is attractive as an environmentally friendly and highly tunable solvent, particle dispersability is even more challenging because of $CO_2$'s weak solvent strength.

Nanoparticles have only been successfully dispersed in liquid and supercritical $CO_2$ through the use of fluorinated ligands (P. S. Shah, et al., *J. Phys. Chem. B* 108, 9574 (2004)) which are, unfortunately, both costly and environmentally persistent. In our methodology, however, the feeble solvent nature of carbon dioxide is harnessed to the benefit of effective particle separation. Since carbon dioxide is a notoriously weak solvent having no dipole moment and little self interaction (E. J. Beckman, *Ind'l & Eng'g Chem. Res.* 42, 1598 (2003); K. P. Johnston, et al., *Science* 271, 624 (1996)), it is an ideal antisolvent for separations. Yet, in spite of their obvious utility as tunable solvent systems, GELs have been popularized only in the past few years, being so far implemented for purposes such as the tuning of reactions (M. Wei, T. Musie Ghezai, H. Busch Daryle, B. Subramaniam, *J. Amer. Chem. Soc'y* 124, 2513 (2002); C. A. Thomas, R. J. Bonilla, Y. Huang, P. G. Jessop, *Can. J. Chem.* 79, 719 (2001)), the switching of fluorous compound solubility (P. G. Jessop, et al., *Inorg. Chem.* 41, 3463 (2002)), and the separation of metallic nanoparticles from reverse micelles in isooctane (J. Zhang, et al., *Chem. Comm.*, 2724 (2001)). Gas expanded liquids have not been previously employed for the size selection and separation of nanoparticles.

Figure 2:
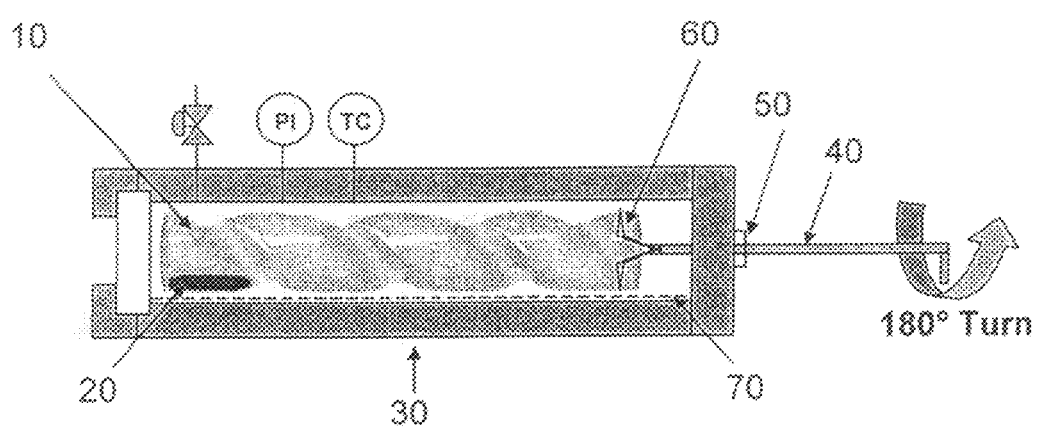
FIG. 2 shows an example nanoparticle size selection apparatus 10 of the invention enclosed in a high pressure vessel 30 with a loading of hexane nanoparticle dispersion 20. Excess hexane 70 was loaded for saturating the high pressure vessel 30 with hexane vapor. A Teflon fitting 50 allows the steel rod 40 to enter into the vessel 30 and maintain the high pressure seal while turning the steel rod 40 180° which rotates the spiral tube 10 with the help of Teflon interconnect 60.

In order to achieve the physical separation of different sized particles from an initially polydisperse population, the precipitation apparatus shown in FIGS. 1 and 2 was developed which permits GEL antisolvent tuning and localized particle precipitation. The basis of the apparatus 10 is comprised of an open-ended glass tube fabricated to include concentric spiral grooves placed into the tube and traversing from end to end. These grooves create a spiral channel within the tube such that rotation of the tube can move the liquid/particle mixture to specific desired locations along the length of the channel. In an example embodiment of the apparatus, the glass tube was 12 cm long by 2 cm in diameter; the concentric spiral grooves were 6 mm deep and created a 2.5 cm wide by 6 mm deep spiral channel. The spiral tube 10 was placed in high-pressure stainless steel cylindrical view cell 30 sealed on one end by a quartz window and on the opposite end with a Teflon fitting 50. The Teflon fitting 50 allows an ⅛ in. stainless rod 40 to enter the vessel 30 and connect with the spiral tube 10 through a Teflon interconnect 60. This interconnect 60 allows rotation of the metal rod 40 from outside the vessel 30 while maintaining a dynamic high pressure seal. As such, the spiral tube 10 can be manipulated to control the location of the particle dispersion 20 within the tube 10.

The hexane-dispersed dodecane-thiol coated silver particles used in the current methods were prepared by arrested precipitation methods (M. B. Sigman, Jr., A. E. Saunders, B. A. Korgel, *Langmuir* 20, 978 (2004); M. Brust, M. Walker, D. Bethell, D. J. Schiffrin, R. Whyman, *J. Chem. Soc'y, Chem. Commun.*, 801 (1994)). A solution of silver ions (0.19 g of $AgNO_3$ in 36 mL of $H_2O$) was combined with an organic solution containing a phase transfer catalyst, tetraoctylammonium bromide (2.7 g of tetraoctylammonium bromide in 24.5 mL of chloroform). After stirring this mixture for 1 h, the aqueous phase was discarded. 240 μL of dodecane-thiol was then added to the organic mixture and stirred for 5-10 min. An aqueous $NaBH_4$ reducing agent solution (0.5 g $NaBH_4$ in 30 mL of $H_2O$) was then added and the mixture was stirred for 4-12 h before discarding the aqueous phase. Ethanol was then added as an antisolvent, followed by centrifugation, to recover the particles. The collected particles were lastly washed several times with ethanol under sonication in order to remove excess phase transfer catalyst. Fisher deionized water was used in the particle synthesis, and all other chemicals were used as supplied by Aldrich Chemical Co. FIG. 3A shows a transmission electron microscope image of the original silver particles, and FIG. 3B shows the corresponding measured size distribution data for the unprocessed nanoparticle population. The particles exhibited a broad size distribution with particles ranging principally between 2 and 10 nm, having a mean size of 5.5 nm, and a 32% standard deviation. This concentrated hexane/particle mixture was then size-selectively fractionated using our GEL apparatus.

Figure 11:
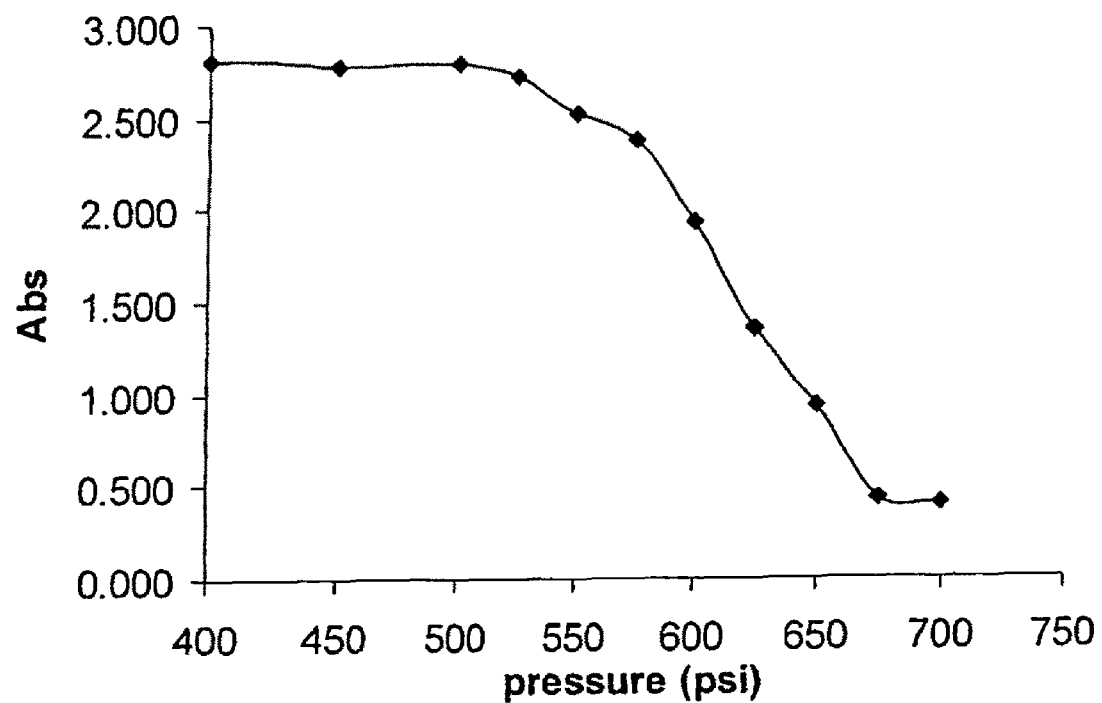
FIG. 11 shows the change in UV-vis absorbance of polydisperse dodecanethiol-stabilized silver nanoparticles at different $CO_2$ pressures. Absorption data has been corrected for the change which would occur due to volume expansion so that absorption change presented depicts particles falling from solution at different $CO_2$ pressurizations.

The intensity of the characteristic 400 nm optical absorbance of silver nanoparticles was measured as a function of $CO_2$ pressure over the hexane solution. This spectroscopy showed a gradual decrease in absorbance intensity primarily between 400 and 700 psi, thereby indicating the target pressurization regions over which particle precipitation would occur. FIG. 11 shows the recorded absorbance change of silver nanoparticles in hexane brought on by their reduced solubility in the $CO_2$-expanded liquid at various pressures. In the recorded absorbance data, both liquid volume expansion and particle precipitation can impact the recorded intensity. Consequently, the absorbance values were corrected for the change in liquid volume using the Peng-Robinson equation of state. Knowing the pressure tunable solubility region, the concentrated hexane/particle mixture could then be size-selectively fractionated using our GEL apparatus.

Particle Deposition

The invention includes a novel particle deposition technique which utilizes carbon dioxide as an anti-solvent for low defect, wide area metallic nanoparticle film formation employing monodisperse metal, e.g., silver and gold, nanoparticles. Ligand-stabilized metallic particles are precipitated from organic solvents by controllably expanding the solution with carbon dioxide. Subsequent addition of carbon dioxide as a dense supercritical fluid then provides for removal of the organic solvent while avoiding the wetting effects common to evaporating solvents. Such effects and interfacial phenomena can be very detrimental to nanoscale structures. Controllable expansion of the liquid solution via $CO_2$ injection allows for control over the thermophysical properties that govern, this deposition and assembly process. In addition to demonstrating the general applicability of this technique, various factors such as carbon dioxide pressurization rate, substrate type, deposition temperature, ligand stabilizer type, and particle composition are described. Nanoparticle films were characterized using transmission electron microscopy (TEM) and atomic force microscopy (AFM).

Disclosed herein is $CO_2$ gas antisolvent induced precipitation and focused deposition of dispersed nanoparticles into wide area thin films. In addition, supercritical fluid processing was used as a means to remove organic solvents without the detrimental interfacial tensions existing in conventional solvent evaporation techniques. This provides a new procedure for nanoparticle thin film formation. The technique utilizes carbon dioxide as an antisolvent for the precipitation of dispersed metal nanoparticles from organic liquid solvents. Specifically, $CO_2$ is added at controlled rates to a solution of dispersed nanoparticles. While the organic liquid expands as a result of $CO_2$ addition (swelling), the solubility is increasingly characterized by the poor solvent strength of $CO_2$, and the particles precipitate onto the desired surface. Continued addition of $CO_2$ and elevation to the supercritical state can then be performed to dissolve the organic solvent and supercritically dry the nanoparticle film. This avoids liquid/vapor phase transitions and their associated surface tensions which can damage the nanoparticle structure.

The method has a number of advantages when compared to traditional particle deposition methods. One of the primary benefits is the elimination through supercritical processing of wetting effects and surface tensions inherent in evaporation of organic solvents. Also, while much of the focus on $CO_2$ as a solvent for particle processing has relied on environmentally persistent and expensive fluorinated ligands in order to solvate nanoparticles in compressed $CO_2$, this new technique does not utilize fluorinated compounds. Fluorinated compounds are not needed because the employed hydrocarbon ligands are sufficient to solvate the particles in organic liquids. The ligand-stabilized particles are highly dispersable in these organic liquids and can, thus, be used to deposit large quantities of particles from small amounts of solution. Furthermore, since there are no surface tensions pulling the particles to interfaces, the particles can be deposited with much greater focus. For example, upon becoming insoluble, the particles precipitate directly onto the substrate due to gravity and are not carried to undesired locations by the liquid/air interface. The $CO_2$ antisolvent method also leaves a smaller environmental footprint as it avoids the use of expensive and environmentally persistent fluorinated molecules while simultaneously allowing for the separation of particles from a minimum amount of organic liquid.

A. Apparatus/Compositions

Apparatus

In one aspect described herein is an apparatus for separating particle dispersions. Described herein is a precipitation apparatus for physical separation of different sized nanostructures from a polydisperse solution comprising a) a first open vessel configured to allow movement of a liquid/particle solution to specific desired locations within the first vessel, b) a second pressure vessel, c) a location controller for controlling location of the particles and solution within the first vessel, d) an inlet for addition of antisolvent to the first vessel, and e) a device for measuring the amount of antisolvent added.

The first vessel can be, for example, an open-ended tube with concentric spiral grooves placed therein and traversing from end to end. The location of liquid/particles within the first vessel can be controlled by rotation of the first vessel. The size of the first vessel can be determined by one of ordinary skill in the art, for example, by the desired number of size fractions to be separated.

The second pressure vessel can be essentially any pressure vessel. The size of the second pressure vessel can be determined by one of ordinary skill in the art based on, for example, the size of the first vessel and the pressures to be handled.

The location controller can be, for example, a rod connected to the first vessel extending through the second vessel for rotating the first vessel. Other means for rotating the first vessel or otherwise controlling location of the particles and solution within the first vessel can be determined by one of ordinary skill in the art.

In order to achieve the physical separation of different sized particles from an initially polydisperse population, the precipitation apparatus shown in FIGS. 1 and 2 was developed which permits GEL antisolvent tuning and localized particle precipitation. The basis of the apparatus was an open-ended glass tube 10 fabricated to include concentric spiral grooves placed into the tube and traversing from end to end. These grooves create a spiral channel within the tube 10 such that rotation of the tube can move the liquid/particle mixture to specific desired locations along the length of the channel. In an example embodiment, the glass tube 10 was 12 cm long by 2 cm in diameter; the concentric spiral grooves were 6 mm deep and created a 2.5 cm wide by 6 mm deep spiral channel. The spiral tube 10 was placed in high-pressure stainless steel cylindrical view cell 30 sealed on one end by a quartz window and on the opposite end with a Teflon fitting 50. The Teflon fitting 50 allowed an ⅛ in. stainless rod 40 to enter the vessel 30 and connect with the spiral tube 10 through a Teflon interconnect 60. This interconnect 60 allowed rotation of the metal rod 40 from outside the vessel 30 while maintaining a dynamic high pressure seal. As such, the spiral tube 10 can be manipulated to control the location of the particle dispersion 20 within the tube 10.

Composition

In one aspect described herein are compositions having a desired nanoparticle size distribution, for example, a monodisperse nanoparticle composition.

A thin film of the invention can include nanoparticles on a substrate comprising a film of nanoparticles with at least about 50% surface coverage of the substrate.

A thin film of the invention can be an improved nanoparticle thin film comprising a more uniform and greater surface coverage and lower defect film of nanoparticles relative to the same nanoparticle thin films deposited from evaporated liquid solvents. The film can have a surface coverage of at least about 50% better than the same evaporated films, for example, at least about twice that of the same evaporated films, or about 250% better than the same evaporated films. The film can have a particle deposition that is more focused than the same evaporated films.

A device, article, or catalyst can comprise a nanoparticle thin film of the invention. One of ordinary skill in the art can determine other appropriate uses for a thin film of the invention.

Compositions of the present invention can be preparing using methods described in the Methods section.

B. Methods

Methods for making ligand-stabilized metal nanoparticles are readily made using techniques generally known to those of ordinary skill in the art. Suitable experimental methods for making nanoparticles are described in, for example, references cited in the Background section. In one aspect, a method for making ligand-stabilized metal nanoparticles is described in the Example 1.

It is believed the methods of the current invention can be used with nanoparticles comprising metal, semi-conductor (e.g., cadmium sulfide), and/or inorganic material.

To overcome the limitations of previous nanoparticle size selection methods and to provide improved control over size selective precipitation, we developed an antisolvent precipitation technique based on the pressure tunable solvent properties of gas expanded liquid mixtures (liquid solvents pressurized with $CO_2$). These compressed liquid solutions of organic solvent and $CO_2$ mixtures are commonly referred to as gas expanded liquids (GELs). Among their many applications, GELs have been used as tunable reaction media (Wei, M.; Musie, G. T.; Busch, D. H.; Subramaniam, B. *J. Amer. Chem. Soc'y* 2002, 124, 2513; Thomas, C. A.; Bonilla, R. J.; Huang, Y.; Jessop, P. G. *Can. J. Chem.* 2001, 79, 719; Xie, X.; Liotta, C. L.; Eckert, C. A. *Ind'l & Eng'g Chem. Res.* 2004, 43, 7907), as adjustable solvents for separations (Gallagher, P. M.; Coffey, M. P.; Krukonis, V. J.; Klasutis, N. *ACS Symp. Series* 1989, 406, 334; Eckert, C. A.; Bush, D.; Brown, J. S.; Liotta, C. L. *Ind'l & Eng'g Chem. Research* 2000, 39, 4615; Chen, J.; Zhang, J.; Liu, D.; Liu, Z.; Han, B.; Yang, G. *Coll. and Surfaces, B: Biointerfaces* 2004, 33, 33; Xie, X.; Brown, J. S.; Joseph, P. J.; Liotta, C. L.; Eckert, C. A. *Chem. Comm.* (Cambridge, United Kingdom) 2002, 1156), in the switching of fluorous compound solubilities (Jessop, P. G.; Olmstead, M. M.; Ablan, C. D.; Grabenauer, M.; Sheppard, D.; Eckert, C. A.; Liotta, C. L. *Inorg. Chem.y* 2002, 41, 3463), and in gas antisolvent (GAS) precipitation techniques for organic and polymer microparticle formation (Randolph, T. W.; Randolph, A. D.; Mebes, M.; Yeung, S. *Biotech. Prog.* 1993, 9, 429). $CO_2$ is an excellent choice in these gas expanded liquids as it is a very weak solvent even at high pressures (Beckman, E. J. *Ind'l & Eng'g Chem. Res.* 2003, 42, 1598) and has no dipole moment and very low refractive index (Shah, P. S.; Hanrath, T.; Johnston, K. P.; Korgel, B. A. *J. Phys. Chem. B* 2004, 108, 9574). As such, the solvent strength of $CO_2$-expanded organic liquid solutions can be varied from that of the pure organic to that of liquid $CO_2$ at pressures below the vapor pressure of $CO_2$.

$CO_2$ is an excellent choice in these gas expanded liquids as it is a very weak solvent even at high pressures (Beckman, E. J. *Ind'l & Eng'g Chem. Res.* 2003, 42, 1598) and has no dipole moment and very low refractive index (Shah, P. S.; Hanrath, T.; Johnston, K. P.; Korgel, B. A. *J. Phys. Chem. B* 2004, 108, 9574). As such, the solvent strength of $CO_2$-expanded organic liquid solutions can be varied from that of the pure organic to that of liquid $CO_2$ at pressures below the vapor pressure of $CO_2$.

This antisolvent effect with $CO_2$ is available because compressed gases such as $CO_2$ dissolve into organic liquids and expand the liquid volume significantly while also altering the liquid's solvation characteristics. McLeod et al. (McLeod, M. C.; Anand, M.; Kitchens, C. L.; Roberts, C. B. *Nano Lett.* 2005, 5, 461) utilized the highly tunable solvent properties of $CO_2$-expanded organic solvents to size-selectively precipitate and separate ligand-stabilized metal nanoparticle dispersions into narrow distributions through fine adjustments in $CO_2$ pressure. By pressurizing an organic solution with $CO_2$, ligand-stabilized nanoparticles were size-selectively precipitated within a novel apparatus that confined the particles to specified locations on a surface allowing their separation. Accordingly, the solvent strength of the medium was tuned through successive $CO_2$ pressurization to provide sequential precipitation of increasingly smaller particles. They developed a novel spiral tube apparatus for separating polydisperse silver nanoparticles into different fractions of uniform sizes by regulating the $CO_2$ pressure and, therefore, altering the liquid's solvation of the particle ligand tails. The advantage of this apparatus is that it separates a polydisperse solution of nanoparticles into fairly monodisperse fractions in one contiguous process. This method has a number of advantages compared to traditional liquid-based size selection methods and can be applied to a broader range of particle sizes as compared to SCF $CO_2$ particle processing at much lower pressures. This method also avoids the use of expensive and environmentally persistent fluorinated molecules commonly used in SCF processing, while simultaneously allowing for the separation of particles from a minimum amount of organic liquid. These characteristics make it a "green" solvent process.

Described herein is a method for size selection of nanostructures comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, of nanostructures onto a surface; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and displaced wherein x=the number of size fractions of nanostructures desired.

The method can further comprise collecting each displaced size fraction, $F_i$. The method can further comprise preparing the solution of dispersed nanostructures and solvent. The method can further comprise physically separating the displaced size fractions of nanostructures from each other. The method can further comprise allowing vapor from the solvent to saturate a pressure vessel such as in an apparatus of the invention before performing steps b)-f).

The nanostructures can be ligand-coated, ligand stabilized and/or sterically stabilized. The solution of nanostructures can be polydisperse. The nanostructures can be nanoparticles, nanospheres, nanocubes, nanotubes or nanorods. In particular, the nanostructures can be dodecane-thiol coated metal, e.g., silver, nanostructures.

The nanostructures can be prepared by conventional methods, for example, arrested precipitation.

The antisolvent can be $CO_2$. The solvent can be organic, for example, hexane.

The pressure increment, $\Delta P_i$, can be, for example, chosen based on a desired degree of polydispersity for the nanostructures within the corresponding size fraction, $F_i$. The pressure increments, $\Delta P = i_{1\ to\ x}$, can be each chosen to achieve a desired level of particle dispersity for the corresponding size fraction, $F_{i=1\ to\ x}$. The pressure, $P_1$, can be about 400 psi. The last pressure, $P_i$, can be about 700 psi.

The methods of the invention can be performed recursively. For example, in a size selection method any fraction can be recursively processed. Recursive processing can result in further narrowing of the size distribution of any fraction recursively processed.

The solution can be in an open first vessel and the first vessel is in a second vessel, for example, an apparatus of the invention.

The equilibrium period, $t_i$, can be about 20 minutes.

The invention includes a method for fractionating multiple monodisperse populations of nanostructures from a single solution comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, $F_i$, of nanostructures; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and separated wherein x=the number of size fractions of nanostructures desired and wherein $\Delta P_i$=the pressure increment corresponding with monodispersity for the solution. The nanostructures can be ligand-coated. The antisolvent can be $CO_2$.

The invention includes a method for selecting mean particle size and standard deviation of nanostructures comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$, will precipitate from the gas-expanded liquid; d) allowing an equilibration period, $t_i$, to precipitate the size fraction, $F_i$, of nanostructures; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and separated wherein x=the number of size fractions of nanostructures desired. The nanostructures can be ligand-coated. The antisolvent can be $CO_2$. The method can further comprise recursive processing to further narrow the size distribution of each fraction.

The invention includes a method for choosing the mean size of precipitated nanostructures in a nanoparticle population comprising a) loading a solution of dispersed nanostructures and a solvent into a vessel; b) adding gaseous antisolvent to the vessel containing the solution to an initial pressure, $P_0$, effective to form the solution into a gas-expanded liquid; c) increasing the gas pressure by pressure increment, $\Delta P_i$, to a subsequent pressure, $P_i$, at which a particular size fraction of nanostructures, $F_i$ will precipitate from the gas-expanded liquid; d) allowing an equilibration period, $t_i$, to precipitate the size fraction, $F_i$, of nanostructures; e) displacing the precipitated size fraction, $F_i$, of nanostructures from the nanostructures remaining dispersed in the gas-expanded liquid; and f) repeating steps c)-e) for i=1 to x times with the remaining solution of dispersed nanostructures until all desired size fractions have been precipitated and separated wherein x=the number of size fractions of nanostructures desired and wherein the mean size of precipitated nanostructures corresponds to the pressure $P_i$. The nanostructures can be ligand-coated. The antisolvent can be $CO_2$.

The invention includes an improved method for size separation of nanostructures comprising a) gas expanding a solution of organic liquid and dispersed nanostructures by pressurizing $CO_2$ over the solution in a vessel to form a gas-expanded liquid (GEL), b) providing an increased pressure, Pi, of $CO_2$ in the vessel to select the fraction of $CO_2$ comprising the GEL thereby tuning the solubility between the solvent strength of the solvent and the liquid $CO_2$ to precipitate the nanostructures no longer soluble in the GEL due to the change in pressure, c) separating the precipitated nanostructures from the nanostructures remaining dispersed in the gas-expanded liquid; and d) repeating steps b) to c) until all desired sizes of nanostructures are precipitated and separated.

Described herein is a method for forming nanoparticle thin films comprising a) providing nanoparticles; b) providing a substrate; c) forming a solution of the nanoparticles dispersed in a liquid solvent wherein the solvent is expandable by a gaseous antisolvent and the gaseous antisolvent is soluble in the liquid solvent and wherein the solution contains the substrate; d) adding a first amount of the gaseous antisolvent to a vessel containing the solution, to pressurize and expand the solution in the vessel, at a rate effective and to a final pressure necessary, to precipitate and deposit the nanoparticles onto the substrate; e) removing the solvent thereby leaving a thin nanoparticle film on the substrate; f) adding a second amount of gaseous antisolvent to the solution effective to mix with and dissolve the solvent away from the nanoparticle coated substrate; g) raising pressure and/or temperature conditions to produce supercritical gaseous antisolvent; and h) maintaining the supercritical conditions for a period of time sufficient to dissolve the solvent and supercritically dry the nanoparticle film.

The nanoparticles can be ligand-coated, ligand stabilized and/or sterically stabilized. The ligand can be chosen to allow dispersability of the nanoparticles in the liquid solvent. The nanoparticles can be any kind of nanostructure, including but not limited to nanospheres, nanocubes, nanotubes or nanorods. The nanoparticles can be metal nanoparticles, for example, gold or silver. The ligand-stabilized nanoparticles can be, for example, dodecanethiol-stabilized silver particles or lauric acid-stabilized silver particles.

The nanoparticle size can be chosen to produce the desired packing or surface coverage of a final nanoparticle film. The concentration of dispersed nanoparticles in the solvent can be, for example, sufficient to completely cover the substrate with at least a monolayer of nanoparticles.

The gaseous antisolvent can be $CO_2$, ethane, propane, $N_2$, or mixtures thereof. $CO_2$ is preferred. An appropriate gaseous antisolvent can be determined by one of ordinary skill in the art. The amount of gaseous antisolvent is an amount effective to create a GEL.

The selection of an appropriate solvent is one satisfies the requirement of being expandable by the antisolvent, e.g., $CO_2$, as well as soluble in the antisolvent, e.g., $CO_2$.

The method can further comprise purging an additional amount of antisolvent effective to ensure removal of the solvent. The method can further comprise bringing the vessel back to ambient pressure after the solvent has been removed.

The pressurization rate can be chosen to correspond with a desired film quality. For example, pressurization with the first amount of antisolvent from 100 psi to 850 psi can occur over a time period of 30 minutes to 5 hours wherein the antisolvent is $CO_2$. The final pressure can be, for example, about 800 psi when hexane is the solvent. One of skill in the art can determine an appropriate pressurization rate.

The liquid solvent can be organic, for example, hexane.

The substrate can be any desired substrate compatible with the other materials used in a method of the invention. The substrate can be carbon coated.

By the term "effective amount" of a composition is meant a sufficient amount of the composition to provide the desired result. As will be pointed out below, the exact amount required may vary. Thus, it is not possible to specify an exact "effective amount." However, an appropriate effective amount can be determined by one of ordinary skill in the art using only routine experimentation.

EXAMPLES

The following examples are put forth so as to provide those of ordinary skill in the art with a complete disclosure and description of how the compounds, compositions, articles, devices, and/or methods described and claimed herein are made and evaluated, and are intended to be purely exemplary and are not intended to limit the scope of what the inventors regard as their invention. Efforts have been made to ensure accuracy with respect to numbers (e.g., amounts, temperature, etc.) but some errors and deviations should be accounted for. Unless indicated otherwise, parts are parts by weight, temperature is in ° C. or is at ambient temperature, and pressure is at or near atmospheric. There are numerous variations and combinations of reaction conditions, e.g., component concentrations, desired solvents, solvent mixtures, temperatures, pressures and other reaction ranges and conditions that can be used to optimize the product purity and yield obtained from the described process. Only reasonable and routine experimentation will be required to optimize such process conditions.

Example 1

Separation of Nanoparticles

In order to achieve the physical separation of different sized particles from an initially polydisperse population, the precipitation apparatus shown in FIGS. 1 and 2 was developed which permitted GEL antisolvent tuning and localized particle precipitation. The basis of the apparatus was comprised of an open-ended glass tube fabricated to include concentric spiral grooves placed into the tube and traversing from end to end. These grooves created a spiral channel within the tube such that rotation of the tube could move the liquid/particle mixture to specific desired locations along the length of the channel. The glass tube was 12 cm long by 2 cm in diameter. The concentric spiral grooves were 6 mm deep and created a 2.5 cm wide by 6 mm deep spiral channel. The spiral tube was placed in high-pressure stainless steel cylindrical view cell sealed on one end by a quartz window and on the opposite end with a Teflon fitting. The Teflon fitting allowed a ⅛ in. stainless rod to enter the vessel and connect with the spiral tube through a Teflon interconnect. This interconnect allowed rotation of the metal rod from outside the vessel while maintaining a dynamic high pressure seal. As such, the spiral tube could be manipulated to control the location of the particle dispersion within the tube.

Figure 3:
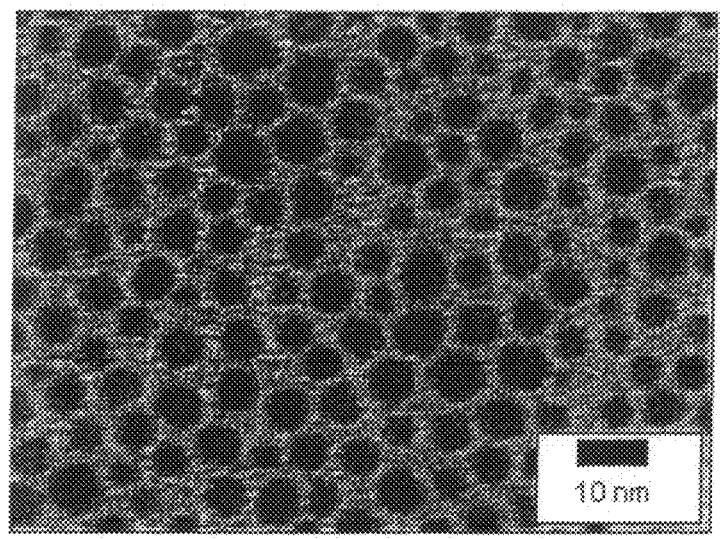
FIG. 3 shows (A) TEM micrograph of unprocessed dodecane-thiol silver particles prepared by two phase arrested growth procedure and (B) corresponding size distribution of unprocessed particles.
Figure 3:
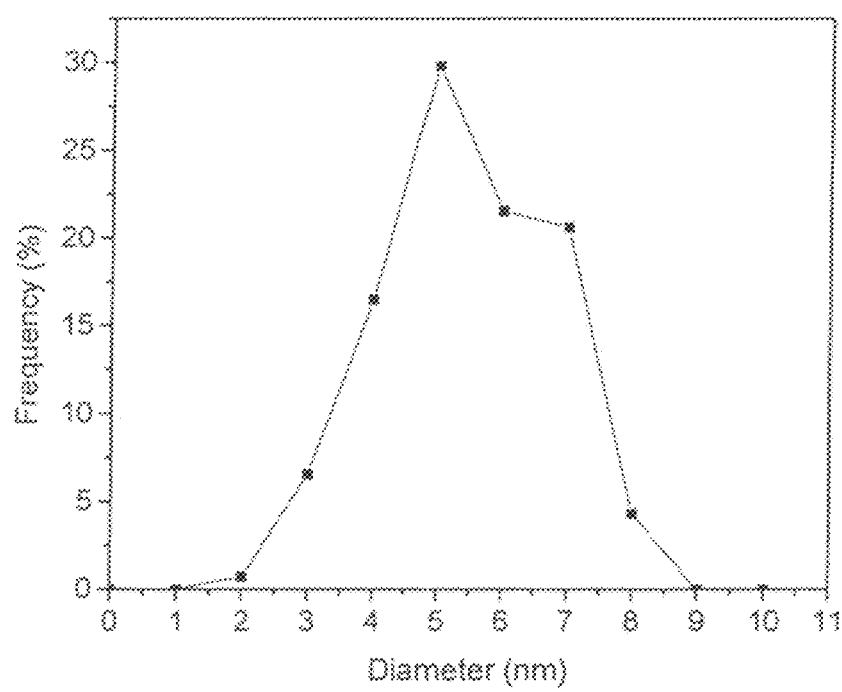

The hexane dispersed dodecanethiol-coated silver particles used in this research were prepared by arrested precipitation methods (M. B. Sigman, Jr., A. E. Saunders, B. A. Korgel, *Langmuir* 20, 978 (2004); M. Brust, M. Walker, D. Bethell, D. J. Schiffrin, R. Whyman, *Journal of the Chemical Society, Chemical Communications*, 801 (1994)). FIG. 3 shows both a transmission electron microscope image of the original silver particles and the measured size distribution data for the nanoparticle population. The particles exhibited a broad size distribution with particles ranging principally between 2 and 10 nm, having a mean size of 5.5 nm, and a 32% standard deviation. This concentrated hexane/particle mixture was then size-selectively fractionated using our GEL apparatus.

To start off the separation process, 700 μL of pure hexane was placed inside the high pressure vessel external to the glass tube and allowed to sit for ca. 10 minutes to facilitate vapor saturation. This was done as a precaution to prevent excessive hexane evaporation at the beginning of each experiment. For the specific case of dodecanethio-coated silver particles, most particle precipitation was observed to occur between 400 and 700 psi by UV-Vis spectroscopy as depicted in FIG. 11. The figure shows the absorbance change of silver nanoparticles in hexane brought on by their reduced solubility in the $CO_2$ expanded liquid at various pressures. The original hexane/particle solution was then placed in the channel nearest the quartz window and the vessel was pressurized to an initial pressure. Once elevated to the starting pressure, the system was allowed to reach GEL equilibrium over a 20 minute time period. During this time, largest fraction of particles, which were no longer soluble in the expanded liquid, precipitate and affixed to the glass surface of the tube through van der Waals attractions. The spiral tube was then rotated to move the liquid to the next location while leaving the precipitated particles behind, affixed on the glass surface. Increasing the pressure to the next chosen level drives the second fraction to precipitate. Such fractionation could be performed as many times as the length of the tube permits, so long as the precipitation areas are separated, with pressure increments selected to achieve the desired level of particle dispersity.

Figure 6:
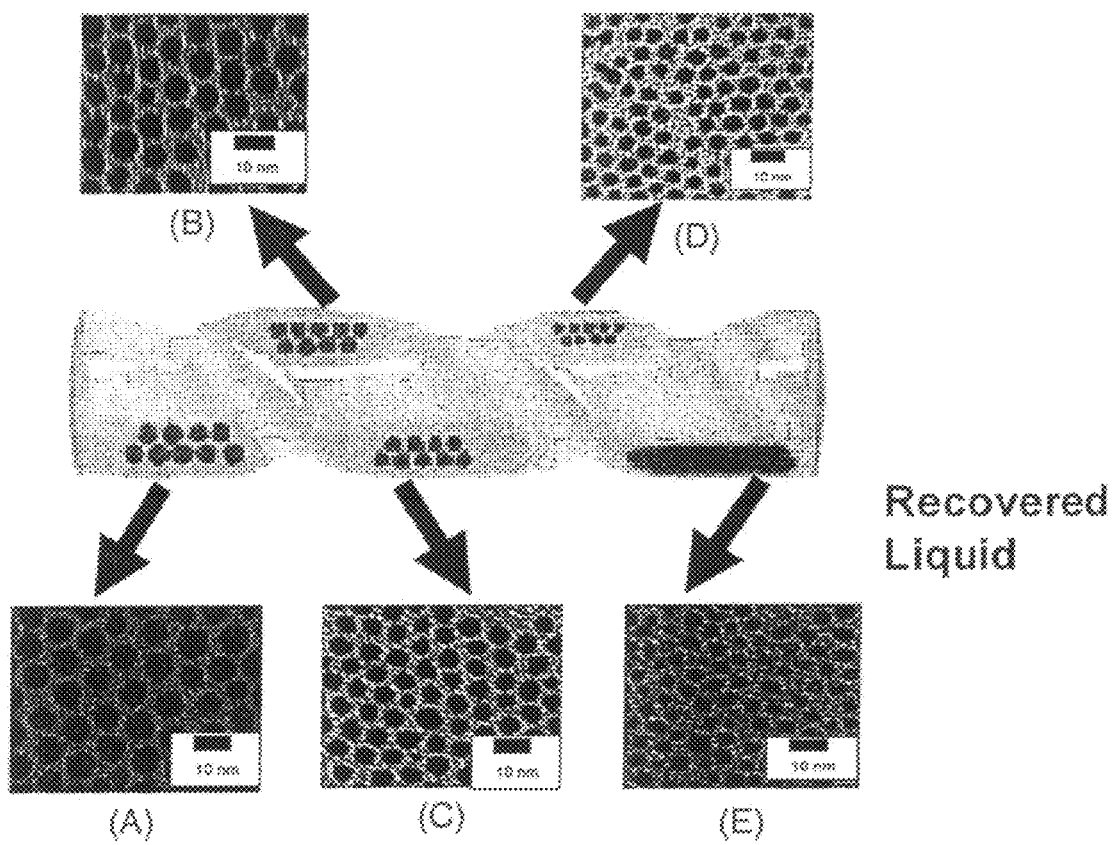
FIG. 6 shows TEM micrographs of particles precipitated from hexane by $CO_2$ pressurization from (A) 0 to 550 psi, (B) 550 to 600 psi, (C) 600 to 625 psi, (D) 625 to 650 psi and (E) 700 psi $CO_2$ pressurization.
Figure 7:
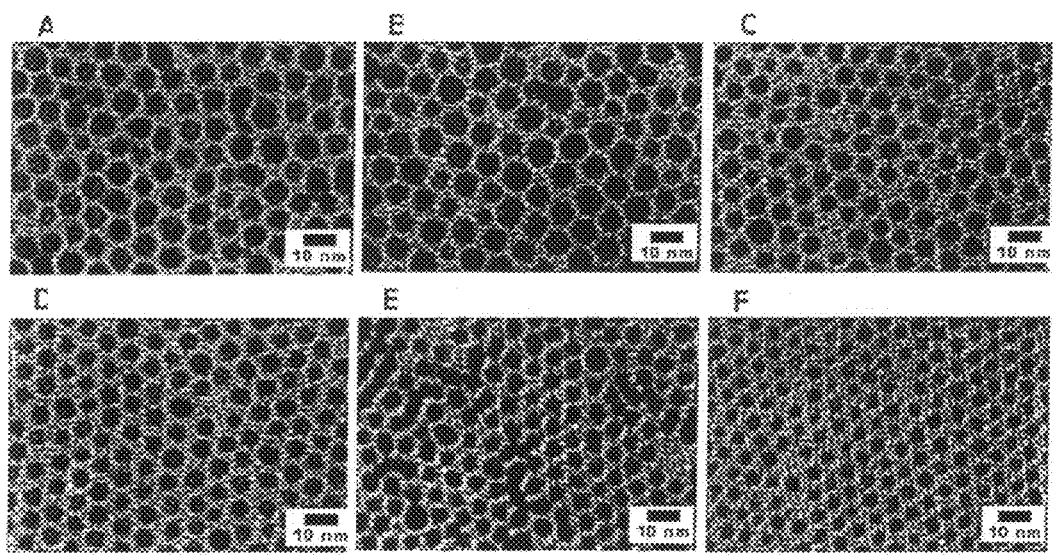
FIG. 7 shows TEM micrographs of particles precipitated from hexane by $CO_2$ pressurization from (A) 0 to 500 psi, (B) 500 to 550 psi, (C) 550 to 600 psi, (D) 600 to 625 psi, (E) and 625 to 650 psi. (F) particles remaining in solution after 650 psi $CO_2$ pressurization.
Figure 8:
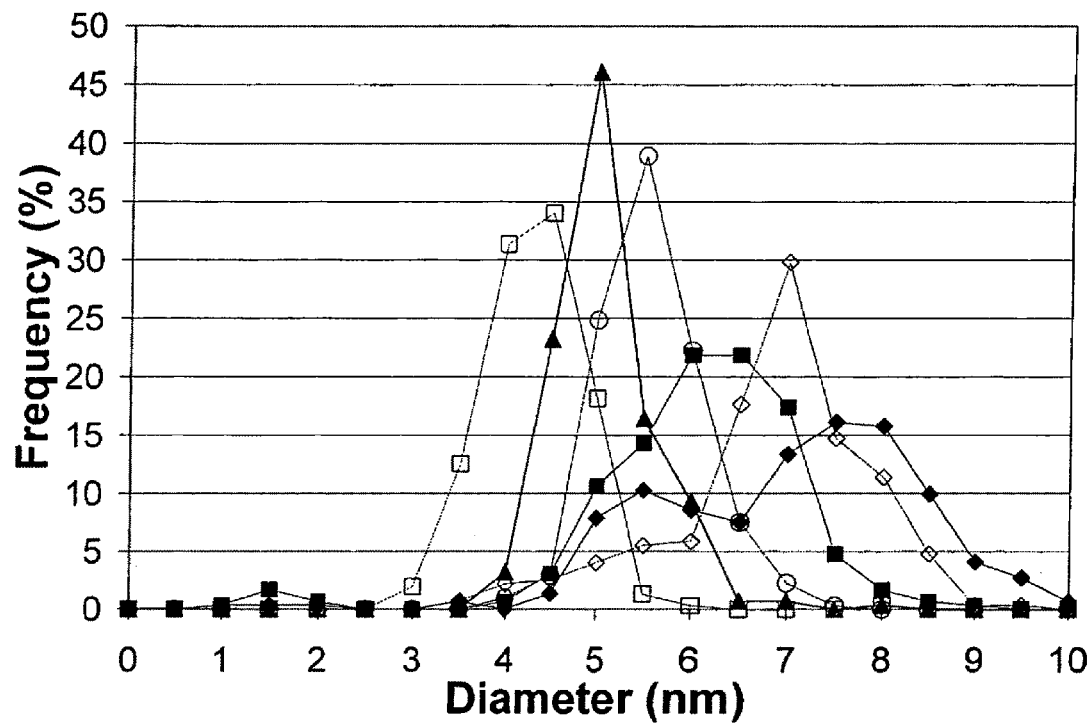
FIG. 8 shows a size distribution of dodecanethiol-coated silver particles fractionated at $CO_2$ pressures of 500 psi (♦), 550 psi (◇), 600 psi (■), 625 psi (○), 650 psi (▲), and particles remaining in solution after 700 psi (□). Data points represent the percentage of particles of the total population found between the associated diameter and 0.5 nm less that diameter.

This original polydisperse particle population was fractionated using GEL tuning as follows: 200 μL of hexane solution containing dispersed Ag-thiol particles was loaded into the starting section of the spiral tube. The pressure was then slowly elevated to 500 psi and allowed to equilibrate over 20 minutes. After the equilibration period, the spiral glass tube was rotated 180° to displace the particles remaining dispersed in the hexane from those which had precipitated and attached to the glass surface. This series of pressurization, equilibration, and displacement was repeated at pressures of 550 psi, 600 psi, 625 psi, and 650 psi. In total, six fractions were recovered when counting the 5 precipitated populations along with the particles remaining in solution after the final pressurization. Particles from each section were collected by redispersing the particles in hexane and then placing a small drop on a carbon-coated copper TEM grid. FIGS. 6 and 7 show the particles collected from each section and allow for their close comparison. The largest particles were precipitated and recovered at 500 psi and successive precipitation of smaller particles continued at increasing pressures. The corresponding size distributions for each recovered fraction are portrayed in FIG. 8 and give quantitative emphasis to the precise separation that can be achieved using this technique. Also, statistical analysis of the original solution and the fractionated populations is shown in Table 1.

TABLE 1

Statistical analysis of particle populations.[a]

| Fraction (psi) | ΔP of fraction (psi) | Mean diameter (nm) | Std Dev (nm) | Relative Std Dev (%) | 95% confidence (nm) | Particle count |
|---|---|---|---|---|---|---|
| Original | 0 | 5.5 | 1.7 | 31.9 | 0.2 | 412 |
| 0 to 500 | 500.0 | 6.7 | 1.4 | 20.7 | 0.2 | 292 |
| 500 to 550 | 50.0 | 6.6 | 1.0 | 15.8 | 0.1 | 272 |
| 550 to 600 | 50.0 | 5.8 | 1.1 | 18.9 | 0.11 | 293 |
| 600 to 625 | 25.0 | 5.3 | 0.5 | 10.1 | 0.1 | 306 |
| 625 to 650 | 25.0 | 4.8 | 0.5 | 11.2 | 0.1 | 280 |
| 650+ | <50 | 4.1 | 0.6 | 13.7 | 0.1 | 280 |
| 575 to 625 | 50 | 5.8 | 0.9 | 16.1 | 0.1 | 514 |
| 597 to 603 | 6 | 5.6 | 0.8 | 14.7 | 0.1 | 613 |

[a]The first six fractions following the original population were separated in a single experiment. The last two fractions were obtained in separate experiments about a common mean pressure of 600 psi. All silver particles precipitate from hexane by 700 psi, therefore the last ΔP is listed as <50 psi.

As expected, smaller pressure changes between precipitations provided even greater precision through more subtle adjustments to solvent strength. When the pressure change to induce precipitation was sequentially lowered from a ΔP of 500 to 50 to 25 psi, the standard deviation fell from 20.7 to 15.8 to 10.1%, respectively. No further cleaning was performed on the fractionated particles, but recursive processing could further narrow the size distribution in a manner similar to liquid/liquid size selection. All six particle populations were selected from the original distribution using only the initial hexane and gaseous $CO_2$ while taking no longer than 1.5 h, a major improvement over current methods.

Figure 10:
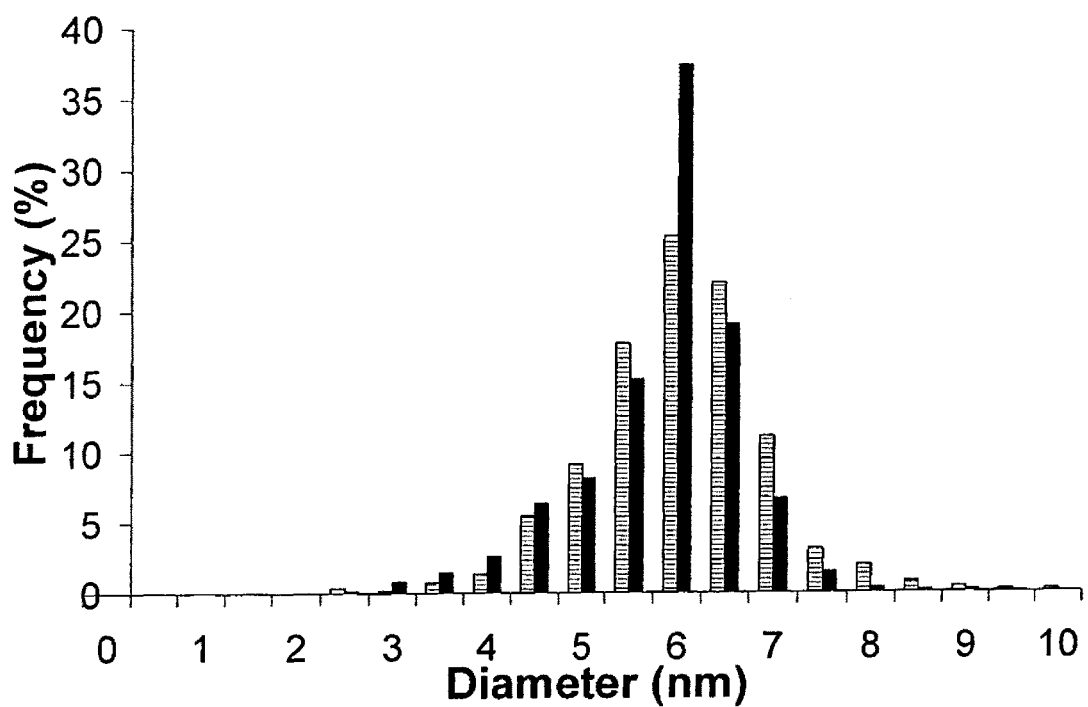
FIG. 10 shows a size distribution of particles fractionated at mean pressures of 600 psi by pressurization from 575 to 625 psi (Delta P=50 psi) (light) and by fractionating from 597 to 603 psi (Delta P=6 psi) (dark).

To further deduce the extent to which the size distribution can be narrowed by decreasing the increment of pressurization, two nanoparticle fractionations were performed about a common mean pressure of 600 psi. The first fractionation was performed as previously detailed but with pressurization to 575 psi followed by 625 psi. The particles precipitated at 625 psi then represent a 50 psi fractionation increment centered at 600 psi. Similarly, the second fractionation was performed between 597 and 603 psi, thus, providing for a smaller 6 psi fractionation increment centered about the common 600 psi mean. The particles obtained from the 50 psi and the 6 psi pressure changes were collected from the vessel as before and placed on the TEM grid using a $CO_2$-antisolvent deposition technique. In this deposition, grids were placed in a 10 mm deep by 6 mm diameter glass tube and filled with 25 μL dilute hexane/nanoparticle solution. The tubes were then placed in a high-pressure vessel and gradually pressurized with $CO_2$ to 800 psi to induce antisolvent deposition of particles on the grid. This technique circumvents interfacial tensions and size selective organization (P. C. Ohara, D. V. Leff, J. R. Heath, W. M. Gelbart, *Physical Review Letters* 75, 3466 (1995)) common to drying liquids that can potentially throw off size characterizations. FIG. 10 shows the population distribution for the two separate pressure changes and demonstrates the size selection capable with both a large and small pressure increment to induce particle deposition. The 50 psi deviation achieved a significant separation with a 16.1% standard deviation, whereas the 6 psi deviation achieved a visibly narrower size distribution with a 14.7% standard deviation. The size distribution of the 6 psi fraction had a narrowed distribution for the majority population but possessed an offset shoulder due to residual small particles. The separation achieved using this GEL technique is remarkable in that an initial polydisperse nanoparticle solution can be narrowed to populations with greater than 55% of the population having $\sigma \leq 5\%$ in a single process step. Traditional liquid size selective separations typically achieve less than 30% of the particles with $\sigma \sim 5\%$ in one process step when starting with a $\sigma \leq 10\%$ (C. B. Murray, C. R. Kagan, M. G. Bawendi, *Annual Review of Materials Science* 30, 545 (2000)) (of course, recursive processing with this GEL technique, as is routinely done in normal liquid based processing, will result in further refinement of the nanoparticles to even narrower distributions). Additionally, the mean size of each recovered population particle was the same, attesting to the repeatability and ability to "tune" for a specific size by dialing in an appropriate pressure.

This demonstrated that $CO_2$ can be used to dramatically improve the traditional liquid solvent/antisolvent size selective precipitation techniques employed for narrowing the size distribution of nanoparticles through pressure-tunable gas-expanded liquids. Not only was the volume of required organic solvent reduced (at the expense of elevated pressures), but multiple nanoparticle populations were separated rapidly while obtaining greater monodispersity of the selected population, all in a single step. Additionally, the pressure can be used to select the precise nanoparticle size that is desired for recovery. For these reasons, this new utilization of $CO_2$ gas-expanded liquids provides the field of nanotechnology with a simple, yet powerful new tool for nanoparticle manipulation, selection, and targeted deposition.

Example 2

Factors Influencing Nanoparticle Size Separation Process

A detailed study was performed to examine the factors influencing the nanoparticle size separation process using $CO_2$ as antisolvent. Variations in ligand-solvent interactions were examined to demonstrate the effects of solvent strength and thiol length on the $CO_2$ pressure range required for particle size separation. The effect of temperature on this pressure range for precipitation was also studied. Recursive fractionation on particles collected at a given pressure range was performed to show that multiple fractionations further improve the $CO_2$ antisolvent size separation process, just as is observed in traditional liquid antisolvent processes.

Materials

Silver nitrate (99.8% purity) ($AgNO_3$) was obtained from Acros. Hydrogen tetrachloroaurate trihydrate (99.9%) ($HAuCl_4 \cdot 3H_2O$), tetraoctylammonium bromide (98%), chloroform (99.8%), sodium borohydride (99%), dodecanethiol (98%), hexanethiol (95%), octanethiol (98.5%), tetradecanethiol (98%), hexane (99%), cyclohexane (99.5%), octane (99%) and heptane (99%) were obtained from Aldrich chemical Co. Pentane (99.6%), toluene (99%), and deionized water was obtained from Fisher. Ethanol (200 proof) was obtained from Florida Distillers. Carbon dioxide (SFC/SFE grade) was obtained from Airgas. All chemicals were used as supplied.

Nanoparticles Synthesis

Ligand-stabilized silver and gold nanoparticles were synthesized by the two-phase arrested precipitation method as developed by Brust, et al. Brust, M.; Walker, M.; Bethell, D.; Schiffrin, D. J.; Whyman, R. *Journal of the Chemical Society, Chemical Communications* 1994, 801.

In short, a solution of 0.19 g of $AgNO_3$ in 36 mL of $D-H_2O$ was mixed with an organic solution of 2.7 g of tetraoctylammonium bromide in 24.5 mL of chloroform. The mixture was stirred for 1 hr, the aqueous phase was removed, and then 240 µL of dodecanethiol was added. A solution of 0.5 g of $NaBH_4$ in 30 mL of D-H20 was added as a reducing agent after stirring the mixture for 5-10 min. The mixture was stirred for 4-12 h before discarding the aqueous phase. In addition to dodecanethiol, other thiols were used to examine the effect of thiol length on the size separation process. In each case, the mole percentage of thiol added was the same as that of the dodecanethiol described above. Gold nanoparticles were synthesized by replacing 0.19 g $AgNO_3$ with 0.38 g hydrogen tetrachloroaurate trihydrate ($HAuCl_4 \cdot 3H_2O$), replacing chloroform with toluene, and adding thiol after 4-12 hours of stirring. The delayed addition of thiol was performed to accommodate the higher affinity of the ligands to gold particles.

Once the thiol-coated metal particle dispersion was formed, ethanol was added as antisolvent. The dispersion of nanoparticles in the solvent/antisolvent mixture was then centrifuged (Fisher Centrific Model 228) to precipitate out the metallic nanoparticles. The particles were again washed with ethanol and centrifuged to remove any unbound ligands. This process of washing with ethanol was repeated 3 times to remove the phase transfer catalyst. The particles were then dispersed in hexane by sonication (Fisher). The remaining dispersion of nanoparticles in hexane was used for further experimentation.

UV-Visible Absorbance Spectroscopy

The UV-visible absorbance spectrum of the particle dispersions in both neat solvent and in the $CO_2$ expanded solvents was measured in a high pressure view cell with a Varian 300E spectrophotometer to monitor the precipitation of gold particles with added $CO_2$ pressure. The cell had a stainless steel body with two O-ring sealed windows on opposite ends. The optical path length of the cell was 3 cm. A quartz cuvette of 10 mm path length was filled with 3 mL of organic solvent and 200 µL of the hexane solution of dispersed nanoparticles. A Teflon cuvette holder was then used to position the dispersion in quartz cuvette at the centerline of the windows. The view cell was then pressurized with $CO_2$ using an ISCO 2600 syringe pump and UV-Vis absorbance spectra were collected at each operating pressure until the maximum absorbance value reached a steady value. This was an indication of an equilibrium condition being reached in terms of particle dispersion.

Size Selective Precipitation Process

The spiral tube apparatus as shown in FIGS. 1 and 2 was fabricated to obtain monodisperse metal nanoparticle populations from an initially polydisperse population through precipitation at specific locations on a surface via $CO_2$ pressurization. This apparatus involved a 12 cm long, 2 cm diameter glass tube modified to include a concentric, spiral indentation on the surface of the tube from one end to the other. These indentations provided a 6 mm deep, 2.5 cm wide spiral channel, or groove, inside of the tube that allowed a liquid droplet of nanoparticle dispersion resting within the channel to be translated from one location to another by a simple rotation of the tube while keeping the length of the tube horizontal. The spiral tube was situated within a cylindrical high pressure stainless steel view cell equipped on one end with an O-ring sealed quartz window for observation. The other end was fitted with Teflon tapered high pressure fitting that allows entry of a ⅛ in. stainless steel rod attached to the spiral tube with a Teflon interconnect. This assembly allowed radial rotation of the spiral tube within the high pressure vessel by simply turning the metal rod from outside the vessel while a dynamic high pressure seal was maintained by the Teflon fitting. The location of a liquid droplet situated in the glass tube channel (inside the tube) can then be controlled by turning the steel rod. The process was initiated by introducing 700 µL of pure hexane into the high pressure view cell in the annular space outside of the spiral tube and allowed to sit for at least 10 min. This hexane was introduced to saturate the system with hexane vapor prior to introducing the nanoparticle dispersion sample. This was done in order to avoid evaporative losses of hexane from the dispersion droplet during the separation process. Next, 250 µL of the hexane dispersion of thiol-coated metal particles was introduced into the channel of the spiral tube at the horizontal position closest to the quartz window as shown in the top image (A) in FIG. 4 (or FIG. 2). The vessel was then slowly pressurized to an initial pressure of 550 psi and allowed 20 min to equilibrate at location A in the spiral tube. The increased concentration of $CO_2$ in the solvent mixture decreased the overall solvent strength such that particles too large to be stabilized by the now weakened $CO_2$/solvent mixture precipitated during this 20 minute settling time.

Van der Waal's forces caused the particles to adhere to the surface on which they precipitated. To separate the remaining liquid dispersion from the precipitated particles, the tube was rotated by turning the rod 180°. This rotation moved the liquid dispersion to the next location B (180° around the tube, but further along axially) leaving behind the precipitated particles affixed to the spiral groove A. The vessel was then pressurized to 600 psi with the suspension at the new location; the particles that precipitated at this pressure were, on average, smaller than those that precipitated at the lower pressure. The glass tube was then turned another 180° to take the dispersion to a new location C leaving this second fraction of affixed particles behind in the second location B. This process was continued to acquire fractions at 625 and 650 psi at positions C and D, respectively. A final precipitation at 700 psi could induce the precipitation of the remaining particles from the hexane dispersion at location E in the spiral tube.

Sample Collection

Figure 4:
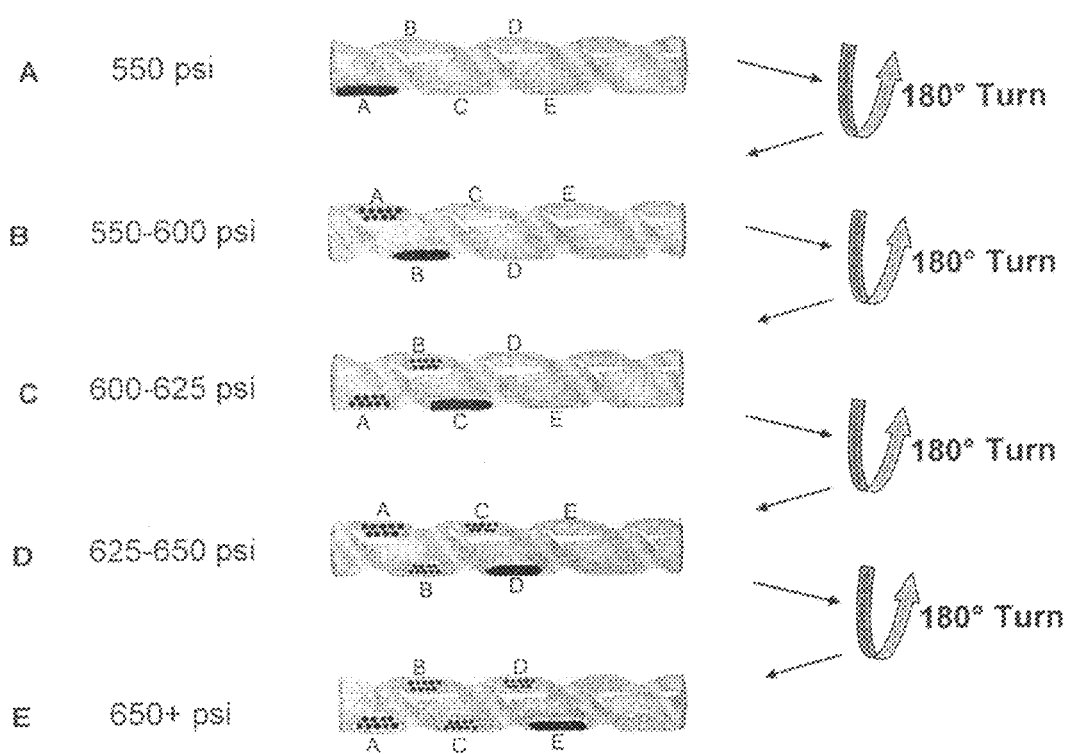
FIG. 4 shows a nanoparticle size selection spiral tube apparatus depicting recursive pressurization of organic liquid with $CO_2$, followed by 180° tube rotations to achieve multiple size-selected populations. A=550 psi; B=550-600 psi; C=600-625 psi; D=625-650 psi; and E=650+ psi.

After completing the final precipitation, the vessel was depressurized. There were 5 particle populations in the spiral tube at locations A, B, C, D and E (FIG. 4). These 5 particle samples were recovered through redispersion in hexane, giving 5 size fractions. Sample grids were made by evaporative deposition and tested for particle size distribution on a Zeiss EM 10 Transmission Electron Microscopy (TEM).

Results and Discussion
Volume Expansion of the Solution

Figure 5:
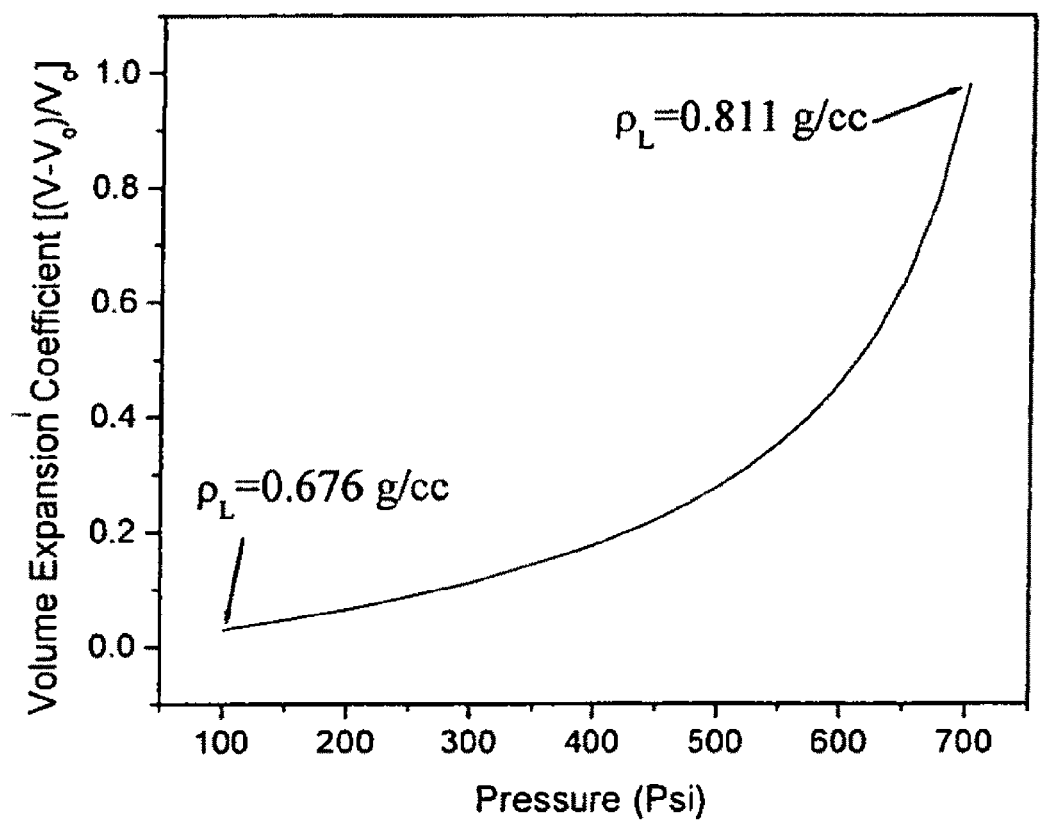
FIG. 5 shows the volume expansion coefficient vs. system pressure for liquid hexane/$CO_2$ mixtures pressurized with gaseous $CO_2$ and modeled using the Peng-Robinson equation of state at 25° C.

When a given organic dispersion of nanoparticles was pressurized with $CO_2$, the volume of the organic phase was increased by dissolution of $CO_2$ until equilibrium. This increase in volume of the organic dispersion/$CO_2$ mixture can be characterized by the volume expansion coefficient, defined as $(V-V_o)/V_o$, where V is the volume of the solution saturated with $CO_2$ at a given pressure and Vo is the volume of the $CO_2$-free solution (unpressurized). This volume expansion coefficient was estimated using the Peng-Robinson equation of state (Peng, D.-Y.; Robinson, D. B. *Industrial & Engineering Chemistry Fundamentals* 1976, 15, 59) and compared well to measurements made by visual observation of volume expansion in a high pressure Jerguson site gauge (less than 5% error between the experimental data and the equation of state in the pressure range of 500 to 700 psi). This volume expansion coefficient is necessary when interpreting UV-Visible spectra to compensate for the decrease in particle concentration that accompanies an increase in solution volume with $CO_2$ pressure. The volume expansion coefficient of hexane for a range of $CO_2$ pressures as determined by the Peng-Robinson equation of state, is shown in FIG. 5 where increases in $CO_2$ pressure significantly increases the volume expansion coefficient as a result of $CO_2$ gas partitioning into the liquid phase. Interestingly, this dissolution of $CO_2$ in the organic solvent also increases the density of the solvent mixture as obtained from Peng-Robinson equation of state, indicating that while these mixtures are referred to as gas expanded liquids, the resulting solution is a dense mixture of liquid $CO_2$ and organic solvent. However, $CO_2$ is a very poor solvent for the solvation of the ligand-coated particles in the organic solvent mixture. Therefore, as the percentage of $CO_2$ increases in the expanded organic solvent, solvent-ligand interactions decrease, and the dispersed particles will precipitate once a threshold solvent strength is passed.

UV-Visible Absorbance Spectroscopy

An increase in $CO_2$ pressure decreased the concentration of dispersed nanoparticles. This is due to a decrease in the solvent strength of the GEL. Here, a decrease in solvent strength means that $CO_2$ has a very poor interaction with the ligands attached to the nanoparticles as compared to the organic solvent. So, as the concentration of $CO_2$ in the GEL was increased, interactions between the ligand tails and the solvent was diminished such that particles were no longer stabilized and start precipitating from the solvent. The precipitation of the nanoparticles from the organic solvent depends on many factors, such as ligand type, solvent type, temperature, and metal type. The effect of each of these variables on the nanoparticle precipitation process was examined in this study.

Figure 12:
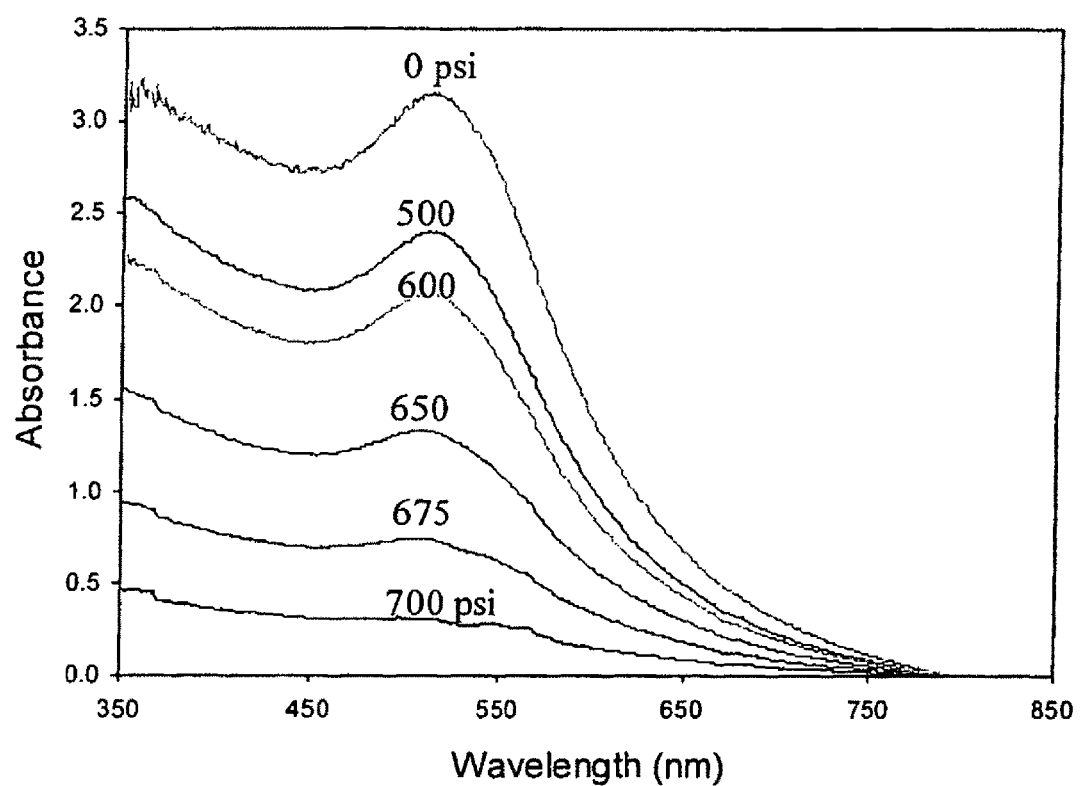
FIG. 12 shows UV-visible absorbance spectra of gold particles dispersed in hexane/$CO_2$ liquid mixtures at increasing $CO_2$ pressures. The spectra were normalized to give zero absorbance at 800 nm wavelength. Decreased absorbance of gold particles after correcting for the volume expansion of hexane shows that particles are precipitating from hexane by increasing the $CO_2$ pressure.
Figure 13:
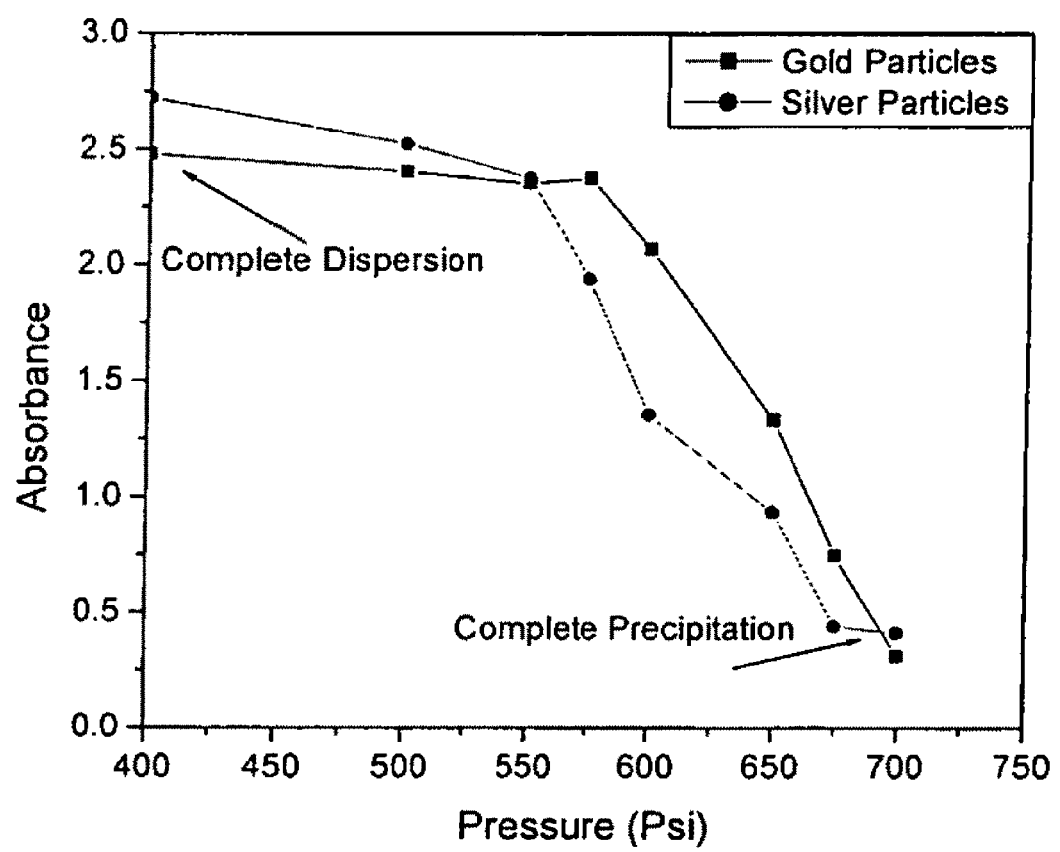
FIG. 13 shows maximum UV-visible absorbance of dodecanethiol coated silver and gold particles dispersed in liquid hexane/$CO_2$ mixtures vs. system pressure. Absorbance values obtained were corrected for the volume expansion of the liquid mixture.

FIG. 12 presents the UV-vis spectra of gold particles synthesized by arrested precipitation and dispersed in hexane (top line). This absorption band is attributed to the absorption of Au nanoparticles dispersed in hexane and is due to the excitation of plasma resonances or interband transitions (Creighton, J. A.; Eadon, D. G. *Journal of the Chemical Society, Faraday Transactions* 1991, 87, 3881). The gold nanoparticles did not precipitate in the absence of $CO_2$ even after extended periods of time. However, the intensity of the UV absorbance band decreased when the nanoparticle dispersion was pressurized with $CO_2$. This decrease in intensity indicated that particles begin precipitating from solution and the absorbance maximum decreased with the increase in pressure. Correspondingly, the absorbance maxima of the UV-Visible spectra, after correcting for the volume expansion of the organic solvent with the addition of $CO_2$, was plotted against the $CO_2$ pressure as a measure of particle concentration that remained dispersed at a given $CO_2$ pressure. FIG. 13 shows a decrease of the absorbance with an increase in the pressure of $CO_2$ and indicates that the gold nanoparticles primarily precipitated from the solution in the range of 500 to 700 psi of $CO_2$ pressure. At pressures higher than 700 psi, complete precipitation occurred. The gold particles used in this experiment had a mean particle size of 5.0 nm and a standard deviation of 26% as shown in Table 2.

TABLE 2

Statistical Analysis of Particle Populations where the five fractions were separated in a single experiment from the original population. All gold particles were completely precipitated from the hexane at 700 psi.

| Fraction (psi) | ΔP of fraction (psi) | Mean diameter (nm) | Std Dev (nm) | Relative std dev (%) | 95% confidence (nm) | Particle count |
|---|---|---|---|---|---|---|
| Original | 0 | 5.0 | 1.3 | 26.0 | 0.1 | 534 |
| 0 to 550 | 550 | 5.7 | 1.3 | 22.4 | 0.1 | 594 |
| 550 to 600 | 50 | 5.5 | 0.9 | 15.9 | 0.07 | 556 |
| 600 to 625 | 25 | 4.8 | 0.6 | 12.5 | 0.05 | 522 |
| 625 to 650 | 25 | 4.3 | 0.5 | 11.0 | 0.04 | 459 |
| 650+ | <50 | 3.4 | 0.7 | 20.6 | 0.06 | 579 |

Also demonstrated was a dramatic decrease in the UV absorbance band for dodecanethiol-stabilized silver particles dispersed in hexane with similar increases in $CO_2$ pressure (also shown in FIG. 13). The mean particle size and standard deviation for these silver particles was 5.5 nm and 31.9%, respectively. Interestingly, the pressure range for the precipitation and the slope of this curve was very similar for both the gold and silver nanoparticles.

TEM Characterization

The particle size precipitated at each pressure range was determined by analysis of TEM images using Image J software.

Figure 9:
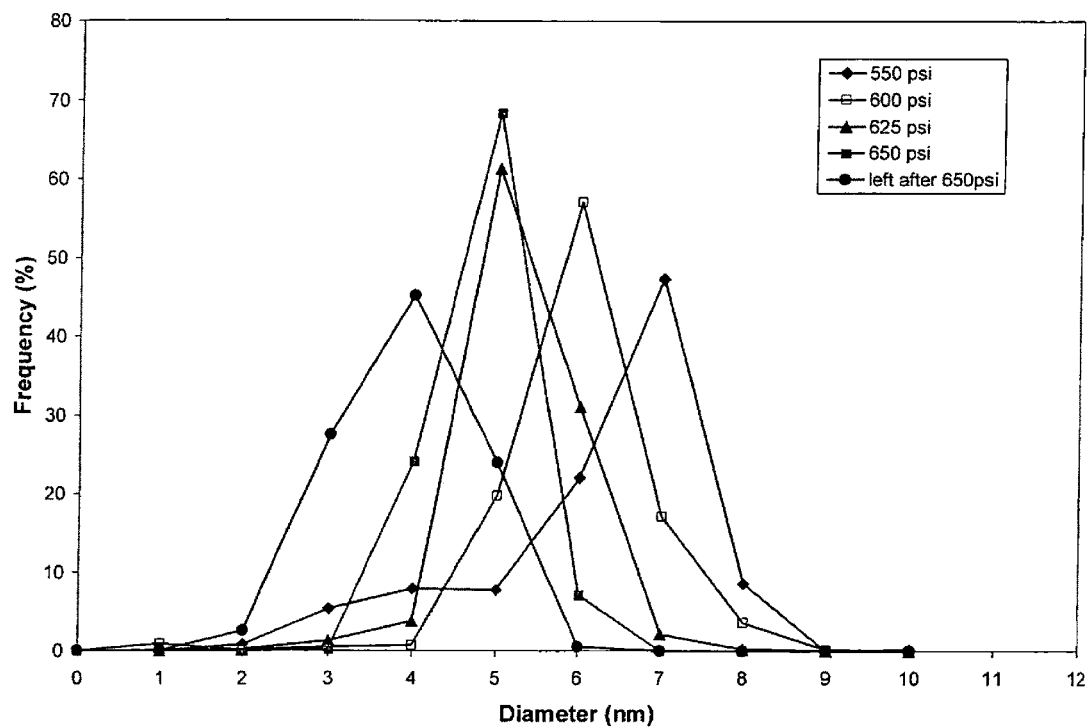
FIG. 9 shows size distributions of dodecanethiol-coated gold particles fractionated within the $CO_2$ pressure ranges of 0-550 psi (♦), 550-600 psi (□), 600-625 psi (▲), 625-650 psi (■), 700 psi (●). Data points represent the percentage of particles of the total population found between the associated diameter and <1 nm less that diameter.

FIG. 3(A) shows an example of the TEM micrographs of unprocessed dodecanethiol-coated gold particles prepared by the two-phase arrested precipitation method as explained above. These images were analyzed to determine the size distribution of this original sample as shown in FIG. 3(B). This original sample of polydisperse dodecanethiol-coated gold particles was fractionated in a spiral tube into 5 fractions corresponding to different pressure ranges at different locations in a spiral tube as shown by arrows in FIG. 6. TEM images of these fractions given in FIG. 6 illustrate that particle size collected within each ΔP decreases with increased $CO_2$ pressure. Moreover, particles in these images were very monodisperse and significantly more ordered into arrays as a result of the size separation process. After analyzing these particles with Image J software, histograms were prepared for all 5 pressure ranges simultaneously as shown in FIG. 9 to quantitatively compare the various fractions. Compared to the wide size distribution (FIG. 3(B)) of the original sample ranging from (2-9 nm), the histograms of the distinct fractions obtained after the size separation process are sharp (±2 nm). The size separation process improved the quality of the particles by increasing the percentage of particles at the median particle size in a single experiment. For example, 30% of the original group of nanoparticles was 5 nm in diameter but after the size separation process, 70% of the particles in the 650 psi fraction were 5 nm. Table 2 shows a statistical analysis of the fractions obtained at different pressure ranges from the size selection process. The relative standard deviation (RSD) of the original sample was 26%. At 550 psi, the RSD was 22.4% because the pressure range, ΔP for collection, was large (0 to 550 psi). The RSD was reduced to 15.9% for the particles precipitated from 550 to 600 psi with a ΔP of 50 psi. The RSD was further reduced to 12.5% at 625 psi and 11.0% at 650 psi with ΔPs of 25 psi in each of these fractionation steps. This illustrates that a smaller ΔP gave a more precise particle separation due to a more subtle change in solvent strength, and the process can be manipulated to obtain a desired particle size. It was shown that pressure can be used as a parameter to obtain a desired particle size. Smaller pressure ranges (ΔP) for precipitation can be used to further narrow the size distribution where a ΔP of 50 psi resulted in RSD of 16.1% and ΔP of 6 psi resulted in a RSD of 14.7% silver particles.

Effect of Solvent Hydrocarbon Length on the Size Selective Precipitation Process Kitchens et al. explained that variations in bulk solvent strength can have a significant effect on the size of nanoparticles that can be sterically stabilized in a given solvent. For example, cyclohexane solvent was shown to disperse larger AOT stabilized copper nanoparticles than was hexane solvent at identical operating conditions as a result of stronger AOT-solvent interactions. Shah and coworkers also demonstrated that the dispersability of dodecane thiol-stabilized gold and silver particles could be varied in liquid and supercritical ethane by altering the pressure and thereby tuning the solvent density. Moreover, variations in solvent strength can play an important role in the precipitation and deposition (Sigman, M. B., Jr.; Saunders, A. E.; Korgel, B. A. *Langmuir* 2004, 20, 978) processes of particles. For example, Sigman and coworkers examined the morphology of dodecane thiol-stabilized gold and silver nanocrystal thin films that were deposited from various solvents, and they attributed the morphology changes to the different interparticle attractions in the organic solvents. Rough superlattice films were obtained from hexane, while smooth films were deposited from chloroform. These works demonstrate that the interactions between the solvent and the particle stabilizing ligands play an important role in the dispersion and precipitation of nanoparticles. In general, a decrease in the solvent strength weakens the solvation of the ligand tails and results in stronger tail-tail interactions (Lee, C. T., Jr.; Johnston, K. P.; Dai, H. J.; Cochran, H. D.; Melnichenko, Y. B.; Wignall, G. D. *Journal of Physical Chemistry B* 2001, 105, 3540) thereby decreasing the particle dispersability. Sufficient solvation of the thiol stabilizing ligand tails is necessary to provide enough repulsive force (osmotic and elastic repulsion) to overcome the van der Waals forces of attraction between the nanoparticles.

Figure 14:
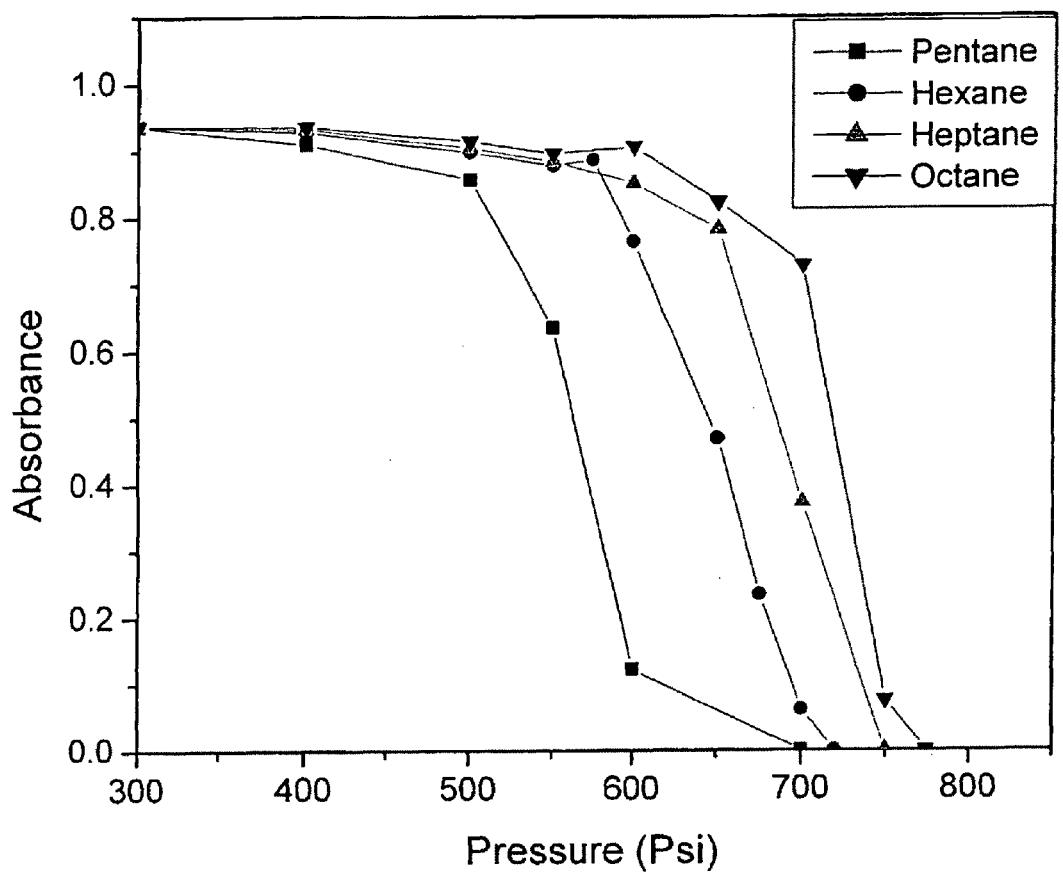
FIG. 14 shows maximum UV-visible absorbance values for dodecanethiol-coated gold nanoparticles dispersed in different hydrocarbon length solvents pressurized with $CO_2$.

The effect of different solvents on the size selective precipitation and fractionation process was examined. FIG. 14 presents maximum UV-visible absorbance values for dodecanethiol-coated gold nanoparticles dispersed in different hydrocarbon length solvents pressurized with $CO_2$. These absorbance maxima were normalized to a common initial value for ease of comparison and zero absorbance simply denotes that all the particles were precipitated from solution at that pressure. In hexane, a large percentage of the particles remained dispersed up to 550 psi after which point more appreciable precipitation occurred (precipitation of successively smaller particles) with further increases in $CO_2$ pressure until all the particles had precipitated at 700 psi and beyond. In contrast to hexane, pentane is a slightly weaker solvent, and as such, appreciable precipitation was initiated at only 450 psi with complete precipitation as low as 600 psi. Given that pentane provides weaker solvation of the ligand tails than hexane, lesser amounts of $CO_2$ were necessary to bring the solvent/$CO_2$ mixture solvent strength below the threshold for dispersability of a given particle size. As a result, the pressure range required for precipitation was less in pentane than hexane. Interestingly, heptane and octane both exhibited stronger interactions with the ligand tails as compared to hexane resulting in more stable dispersions in the longer chain length solvents. Correspondingly, greater $CO_2$ pressure was required to reach the same weakened solvent strength of the solvent/$CO_2$ mixture to induce precipitation of nanoparticles of a given size. FIG. 14 shows that the length of the organic solvent influences the gold nanoparticle precipitation process where the longer length solvent molecules have stronger interactions with the nanoparticle ligand tails compared to the shorter length solvent molecules. Additional results of similar experiments performed with cyclohexane, decane, isooctane, and toluene are not shown in FIG. 14. In these solvent systems, particle dispersability remained quite high even at $CO_2$ pressures approaching the vapor pressure of $CO_2$ where the dodecane thiol-coated gold particles remained dispersed in the solvent/$CO_2$ mixtures for several hours.

Effect of Thiol Length on the Size Selective Precipitation Process

Figure 15:
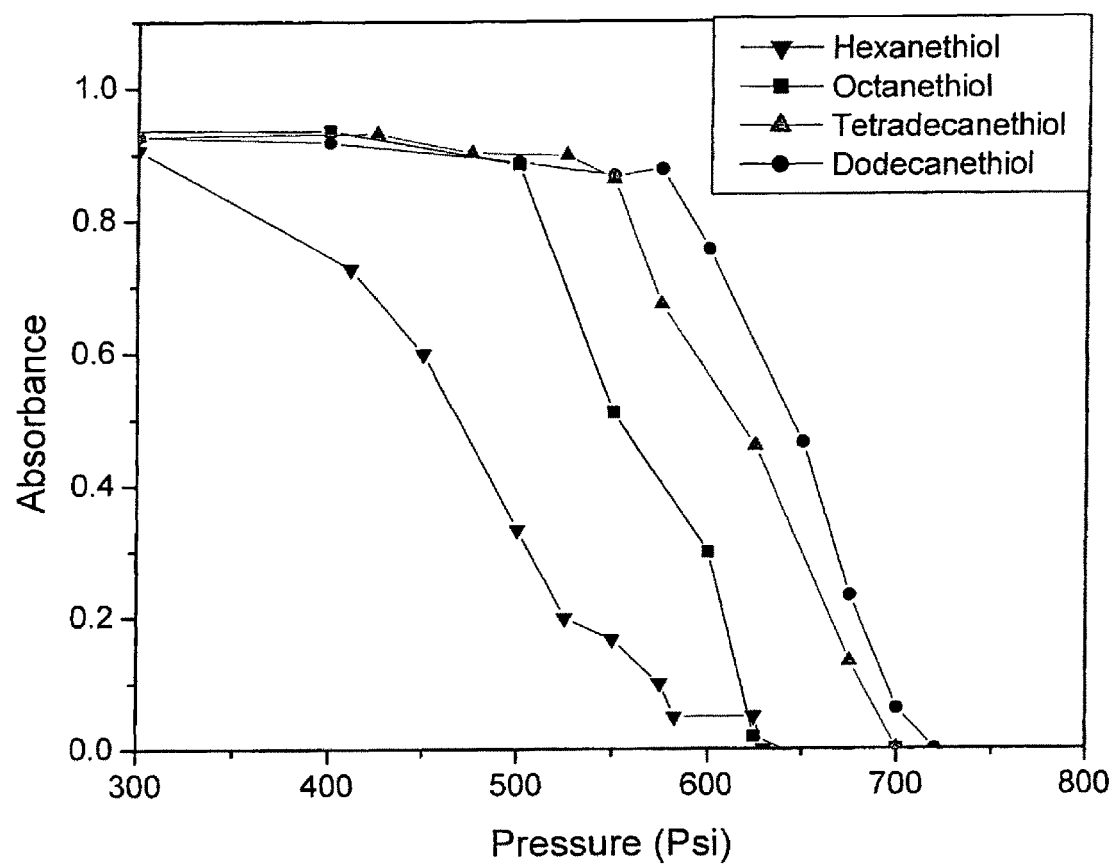
FIG. 15 shows maximum UV-visible absorbance values for gold nanoparticles coated with different thiol length molecules dispersed in liquid hexane/$CO_2$ mixtures at increasing $CO_2$ pressure.

Martin et al. (Martin, J. E.; Wilcoxon, J. P.; Odinek, J.; Provencio, P. *Journal of Physical Chemistry B* 2000, 104, 9475) stated that among all the alkyl thiols, dodecanethiol is more strongly bound to gold particles than hexanethiol or hexadecanethiol. Prasad, et al. (Prasad, B. L. V.; Stoeva, S. I.; Sorensen, C. M.; Klabunde, K. J. *Langmuir* 2002, 18, 7515) studied the effect of the alkyl chain lengths of thiol molecules on the formation of gold nanoparticle superlattices. These authors described that there is a decrease in particle-particle attraction energy with an increase in the thiol hydrocarbon chain length. For example, particles aggregated into 3D superlattices with short chain lengths, i.e, octanethiol and decanethiol ($C_8$ and $C_{10}$), due to particle-particle attraction. Larger chain length in hexadecanethiol resulted in weakly bound multilayers and hindered the development of 3D superlattices. These works demonstrated the impact of thiol chain length on particle-particle attraction. In the current study, dispersion of particles in solution requires that these attractive interactions be finely balanced by the osmotic repulsion and an elastic contribution generated by interactions between the solvent and the thiol stabilizing ligands. As shown above, modification of the solvent strength of the solution (i.e., $CO_2$ pressurization) resulted in changes in these attractive and repulsive interactions thereby inducing precipitation. Changes in this fine balance can also be accomplished by altering the thiol chain length such that there is a modification to the interaction between the solvent and the thiol ligand tails. Here we present the influence of various thiol chain lengths on the $CO_2$ pressurization range required to induce precipitation. As shown in FIG. 15, precipitation of the particles stabilized with octanethiol ligands occurred between 400 and 600 psi as compared to 500 to 700 psi for particles stabilized by dodecanethiol ligands. The precipitation of particles with hexanethiol ligands was similar to those with octanethiol ligands, and the curve was shifted to a lower pressure range (300-575 psi). Particles stabilized with tetradecanethiol ligands required a smaller. $CO_2$ pressure for the precipitation of particles compared to dodecanethiol ligands, even though they have a longer tail length. The shorter tail length for octanethiol and hexanethiol ligands decreased the $CO_2$ pressure required for precipitation in a GEL compared to dodecanethiol ligand stabilized particles. This effect was because the shorter length ligands have smaller interactions with the solvent compared to the longer length ligands. Tetradecanethiol ligand-stabilized particles also required less $CO_2$ pressure for the nanoparticle precipitation than dodecanethiol ligand-stabilized particles because of larger tail-tail interactions. These results suggested that dodecanethiol ligands have the optimum length for strong ligand-solvent interactions. Prasad, B. L. V.; Stoeva, S. I.; Sorensen, C. M.; Klabunde, K. J. *Langmuir* 2002, 18, 7515.

Effect of Temperature on the Size Selective Precipitation Process

Figure 16:
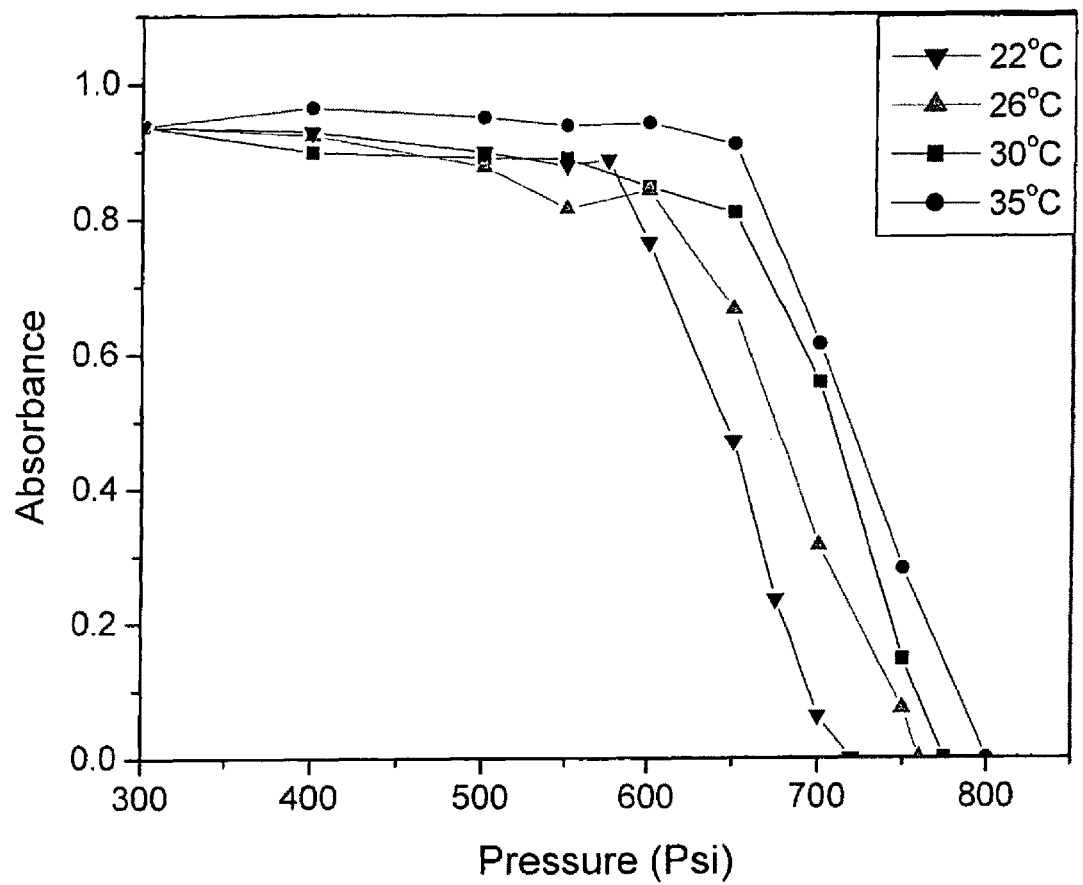
FIG. 16 shows maximum UV-Visible absorbance values for dodecanethiol-coated gold nanoparticles dispersed in liquid hexane/$CO_2$ mixtures at various $CO_2$ pressures and system temperatures.

Temperature also has a pronounced effect on nanoparticle stabilization and dispersibility. As shown by Shah and coworkers, temperature affects solvent density, which affects the nanoparticle dispersability in an organic solvent. Temperature affects on the precipitation of gold particles stabilized with dodecanethiol ligands in hexane are shown in FIG. 16. At the lowest temperature of 22° C., the nanoparticle precipitation occurred between 500 and 700 psi $CO_2$ pressure. At the highest temperature of 35° C., this pressure range for precipitation was shifted up to 650 to 800 psi, illustrating that an increase in pressure was required for precipitation with an increase in temperature. This variation was due in part to the $CO_2$ density change with temperature. As temperature increased, the mole fraction of $CO_2$ in the organic liquid/$CO_2$ mixture was reduced resulting in a smaller volume expansion of the liquid dispersion at a given pressure. This, therefore, reduced the antisolvent effect in the nanoparticle precipitation process.

Recursive Fractionations

Figure 17:
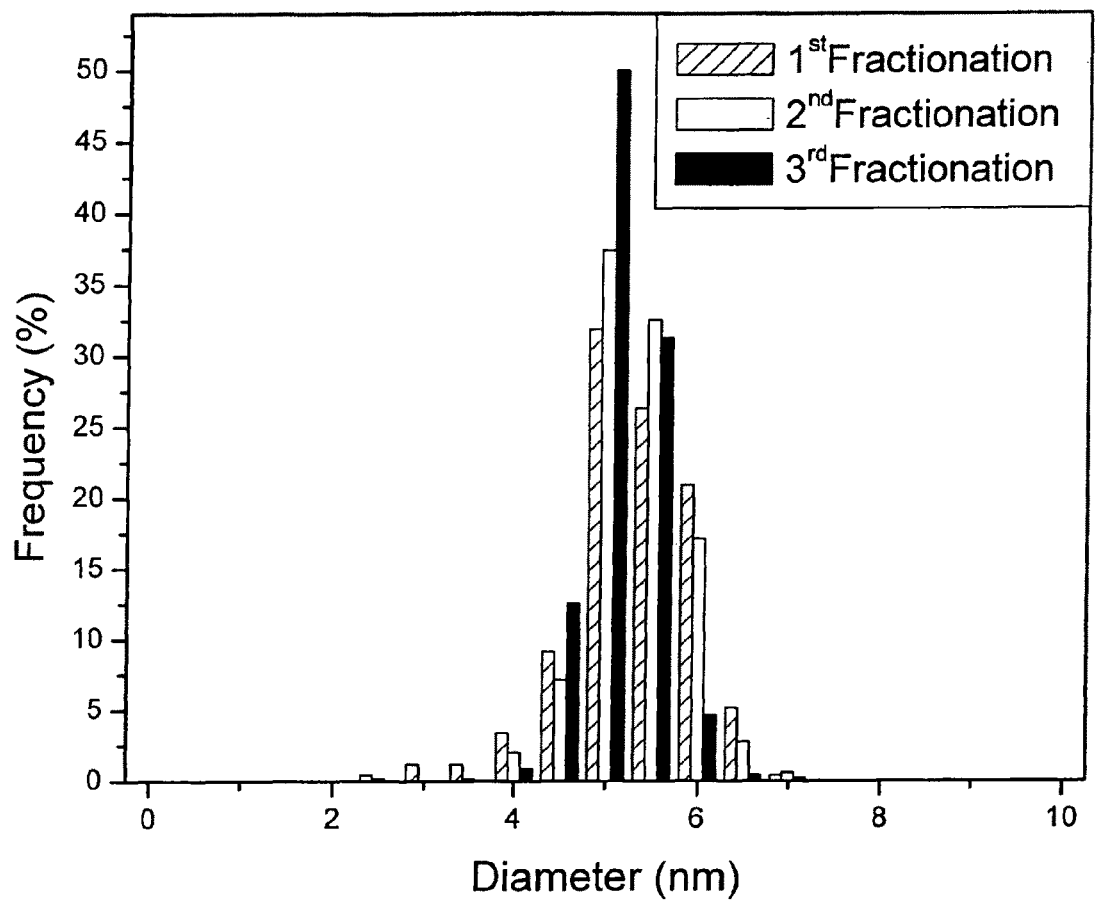
FIG. 17 shows a comparison between the size distributions of gold particles collected in the pressure range of 625 to 650 psi after fractionation one, two or three times. Particles from the $1^{st}$ fractionation were obtained from the location D in the spiral tube apparatus corresponding to pressure range of 625-650 psi. This $1^{st}$ fractionation sample was returned to location A, and the size separation process was repeated. The $2^{nd}$ fractionation sample was again obtained from position D. In the same way, the $3^{rd}$ fractionation was obtained by placing the $2^{nd}$ fractionation sample at location A and collecting the particles precipitated at location D. Data points represent the percentage of particles of the total population found between the associated diameter and <0.5 nm less that diameter.

Korgel and coworkers used ethanol recursively as an antisolvent to improve the size separation process. In the current study, a set of size separation experiments were repeated on one of the recovered fractions (particles collected within a given pressure range at one location in the spiral tube) to further improve the size separation process using $CO_2$ as an antisolvent. The results of the recursive fractionation are summarized in FIG. 17]. The size separation process, shown in FIG. 4, was done by placing the original polydisperse sample at location A in the spiral tube. The $1^{st}$ fractionation sample, at location D, shown in FIG. 17 was the sample of particles precipitated within the pressure range of 625-650 psi. In this recursive process, this $1^{st}$ fractionation sample was collected at the end of the experiment and was returned to location A, and the size separation process was repeated. The $2^{nd}$ fractionation sample shown in FIG. 17 was again obtained from position D within the same pressure range of 625-650 psi. In the same way, the $3^{rd}$ fractionation was obtained by placing the $2^{nd}$ fractionation sample at location A and collecting the particles precipitated at location D within the same pressure range. The separation was improved during each successive processing step with a decrease in the standard deviation from 13% to 8% as shown in Table 3.

TABLE 3

Statistical analysis of particle populations for different number of fractionation steps.

| Fractionation (number) | Mean Diameter (nm) | Std dev (nm) | Relative std dev (%) | Fraction (psi) | 95% confidence (nm) | Particle count |
|---|---|---|---|---|---|---|
| 1 | 5.0 | 0.7 | 13.1 | 625-650 | 0.06 | 502 |
| 2 | 4.9 | 0.5 | 10.0 | 625-650 | 0.04 | 642 |
| 3 | 4.9 | 0.4 | 8.1 | 625-650 | 0.04 | 454 |

This process is an improvement over the liquid antisolvent process where the desired size is controllably obtained as a function of pressure. For instance, keeping the solvent, thiol length and temperature the same, this process will always result in a ~5.0 nm sized fraction of gold particles collected at 650 psi since the precipitation is governed simply by the solvent strength. Therefore, this $CO_2$ antisolvent size separation process gives a predictable particle size at a given $CO_2$ pressure. On the other hand, the number of variables involved in the liquid antisolvent process including the specific amount of ethanol addition and the centrifugation time makes predictable size selection challenging.

Effect of Time on the Size Selective Precipitation Process

Figure 18:
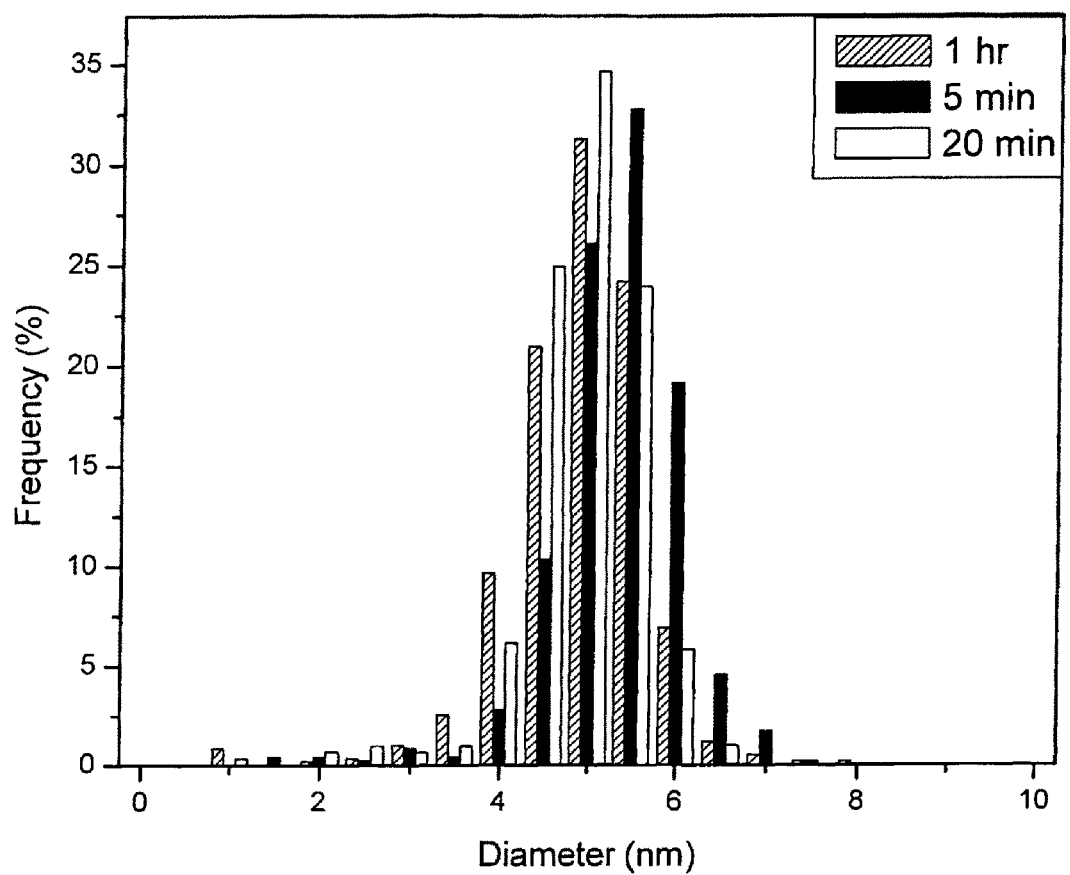
FIG. 18 shows a size distribution of gold particles stabilized with dodecanethiol ligand in hexane for 3 different holding times at 625 psi. Data points represent the percentage of particles of the total population found between the associated diameter and <0.5 nm less that diameter.

During this size section process, the liquid droplet with dispersed nanoparticles is moved to a specific location on the surface of the spiral tube followed by an increase in pressure that initiates precipitation of particles within that pressure range. Once the desired pressure was reached, the system was allowed to sit for a specified period of time allowing precipitation of the particles, and this period of time is referred to as the holding time (FIG. 18). Table 4 presents standard deviations for particles precipitated during three different holding times in the pressure range of 600-625 psi.

TABLE 4

Statistical analysis of particle populations for different settling times at each step of fractionation

| Settling time (min) | Mean diameter (nm) | Std dev (nm) | Relative std dev (%) | 95% confidence (nm) | Particle count | Fraction (psi) |
|---|---|---|---|---|---|---|
| 5 | 5.1 | 0.75 | 14.6 | 0.06 | 464 | 600 to 625 |
| 20 | 4.7 | 0.70 | 14.9 | 0.07 | 309 | 600 to 625 |
| 60 | 4.7 | 0.79 | 16.9 | 0.06 | 591 | 600 to 625 |

The results discussed above were collected during a holding time of 20 min where a mean size of 4.7 nm and the standard deviation of 14.9% were obtained as given in Table 4. For holding time of 1 hr, the mean size and standard deviation were 4.7 nm and 16.9%, respectively. It was found that a 5 min holding time resulted in a standard deviation of 14.6% with a mean nanoparticle size of 5.1 nm. The experiments performed at different holding times suggested that there is little difference in the size distribution of the nanoparticles collected indicating that the system quickly reaches an equilibrium. This demonstrated that the size separation process using $CO_2$ as the antisolvent is a very rapid process compared to the liquid antisolvent process which requires several hours for the separation of the same quantity of particles.

Conclusions

A method for precise, rapid, pressure tunable, size selective nanoparticle precipitation and redispersion using tunable $CO_2$ gas-expanded liquids was developed. This technique is a marked improvement over the current techniques of nanoparticle fractionation employing liquid antisolvent techniques. In this size separation process, dodecanethiol-stabilized polydisperse gold nanoparticles dispersed in hexane were fractionated into monodisperse fractions using $CO_2$ pressurization in the range of 500-700 psi. The original sample of dodecanthiol-stabilized gold particles of 26% polydispersity were successfully separated into fractions of as low as 11% polydispersity in a single step process. To understand the precipitation process in more detail, the effect of various parameters on the size separation process was studied. Variations in solvent length from five to eight hydrocarbon chains had a significant effect on the pressures required for precipitation of dodecanethiol-coated gold nanoparticles. Experiments in which the thiol stabilizing ligand length was varied illustrated that dodecanethiol provided the best solvent—ligand tail interaction when hexane was the bulk solvent medium. It was also found that as the solvent temperature was increased an increase in $CO_2$ pressure is required to completely precipitate all the nanocrystals from solution. Recursive fractionations on a sample collected within a given pressure range elicited the desired nanoparticles of a precise size. This new process is very fast, repeatable and reproducible requiring very short holding time at each precipitation stage.

Example 3

Nanoparticle Film Deposition Process

Materials/Methods

Carbon dioxide was purchased from BOC Gases. Fisher deionized water was used in particle synthesis, and all other chemicals were used as supplied by Aldrich Chemical Co. Silver bis(2-ethylhexyl)sulfosuccinate, Ag(AOT), was prepared using a reported ion exchange method. Eastoe, J., Fragneto, G., Robinson, B. H., Towey, T. F., Heenan, R. K., Leng, F. J. *J. Chem. Soc., Faraday Trans.* 1992, 88, 461-471.

Dodecanethiol Stabilized Silver Particle Synthesis

Figure 19:
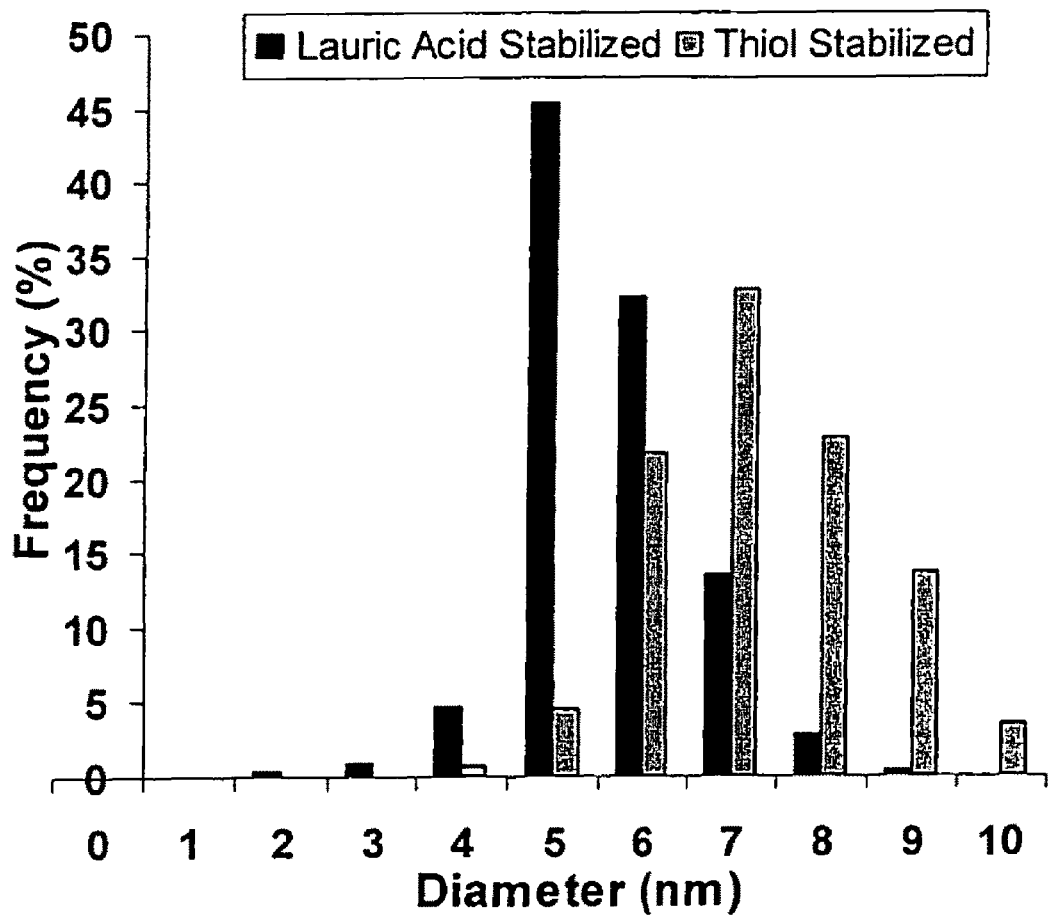
FIG. 19 shows size distribution of the lauric acid- (dark) and Dodecanethiol- (light) coated silver particles employed for particle deposition. Data demonstrates smaller average size of lauric acid-stabilized population (5.1 nm) as compared to dodecanethiol-coated particles (6.8 nm).

Dodecanethiol-stabilized particles were prepared by arrested precipitation as reported previously. Sigman, et al., 2004; Brust, et al., 1994. A 36 mL aqueous solution containing 0.19 g of $AgNO_3$ was combined with a 24.5 mL chloroform solution containing 2.7 g of the phase transfer catalyst tetraoctylammonium bromide $[CH_3(CH_2)_7]_4NBr]$. After stirring this mixture for 1 h, the aqueous phase was discarded and 240 μL of dodecanethiol $(CH_3(CH_2)_{11}SH)$ was added to the organic mixture and stirred for 5-10 min. A 30 mL aqueous solution containing 0.5 g of $NaBH_4$ reducing agent was then added to the chloroform mixture and stirred for 4-12 h before the aqueous phase was discarded. Ethanol was then added as an antisolvent, followed by centrifugation, to recover the particles. The recovered particles were lastly size selectively precipitated using chloroform/ethanol as the solvent/antisolvent pairs. The final thiol-coated particle population possessed an average size of 6.8 nm, a standard deviation of 1.2 nm, and the size distribution shown in FIG. 19 (285 particles counted). The particles were redispersed in either chloroform or hexane solvent for subsequent deposition.

Lauric Acid Stabilized Particle Synthesis

Lauric acid-coated silver particles were synthesized by first forming particles in an AOT-isooctane reverse micelle system following literature methods. Petit, et al., 1993. A 100 mL microemulsion was formed containing [AOT]=0.1 M, [AgAOT]=0.01 M, a water content of W=10 (where W=$[H_2O]/[AOT]$), and bulk isooctane. The $Ag^+$ in the reverse micelles was reduced by a 200 μL 0.03 M $NaBH_4$ solution that was mixed with the microemulsion. After 2 h, lauric acid was added to the microemulsion at 0.05 M concentration and allowed to mix for 24 h. Ethanol was then added as an antisolvent, and the solution was centrifuged to recover the clean particles. For these particles, isooctane and ethanol were used as the solvent/antisolvent pairs to narrow the size distribution. These lauric acid-coated particles exhibited an average size of 5.1 nm, a standard deviation of 0.9 nm, and the size distribution shown in FIG. 19 (252 particles counted). The lauric acid-coated particles were then redispersed in hexane for particle deposition.

Particle Deposition

Silver particles stabilized by either dodecanethiol or lauric acid were deposited from organic solvents. To perform the particle deposition experiments, a carbon-coated 400 mesh copper TEM grid was placed in a 1 cm deep by 6 mm diameter glass tube and then filled with 30 μL of organic solution containing dispersed nanoparticles. Chloroform and hexane were used as solvents containing the dispersed nanoparticles in concentrations adequate for complete surface coverage of the substrate with a monolayer of nanoparticles. Once the glass tube was loaded with solution, it was then placed in a Teflon sleeve which secured the tube within a 50 mL stainless steel high-pressure vessel. The vessel was subsequently sealed with a metal faceplate and a quartz window so the liquid expansion and particle deposition could be visually observed. A 1/16" resistive temperature detector and heating tape were fitted to the pressurization chamber so that the temperature could be monitored and controlled. The vessel was also connected to a Heise pressure gauge for accurate monitoring of the pressure. FIG. 2 depicts the nanoparticle deposition apparatus.

An ISCO syringe pump filled with $CO_2$ gas was used to pressurize the chamber at a controlled rate and thereby gradually precipitate the particles from solution. All films were deposited at room temperature (25° C.). Typically, the chamber was filled to 100 psi (at equilibrium pressure with the syringe pump) and then pressurized by setting a flow rate ranging from 1 to 10 mL/min to give a final pressure of ca. 800 psi, at which point all particles have precipitated. Following the gaseous pressurization, liquid expansion, and particle precipitation, more $CO_2$ was added until dense liquid $CO_2$ filled the vessel at 1000 psi. At this point, the liquid $CO_2$ came into contact with the $CO_2$-expanded organic solvent where it could mix with and dissolve the solvent away from the nanoparticle-coated surface. Elevation of the $CO_2$ to the supercritical state by increasing the temperature to 40° C. and pressure to 1700 psi then encouraged dissolution of the organic solvent while also making certain that any gas/liquid interfaces were avoided. A short purge of around 10 mL liquid $CO_2$ next ensured removal of the organic so that it could not redissolve and disorganize the particles upon depressurization. The chamber was then vented of $CO_2$ over approximately 15 min to avoid the surface tensions that can disrupt the particle film.

Results and Discussion

Deposition of Silver Nanoparticles from $CO_2$-Chloroform

The initial experiment used chloroform as the organic liquid, but it was discovered that while chloroform readily expands under $CO_2$ pressure, it is not readily miscible with liquid $CO_2$ and upon depressurization the particles redisperse in the chloroform. This emphasized the need for careful selection of an appropriate solvent that satisfies the requirement of being expandable by $CO_2$ as well as soluble in $CO_2$. As a result, all ensuing experiments used hexane solvent, since it both expands under $CO_2$ pressure and is miscible in liquid $CO_2$.

Deposition of Thiol-Coated Silver Nanoparticles from Air Dried Hexane

Figure 20:
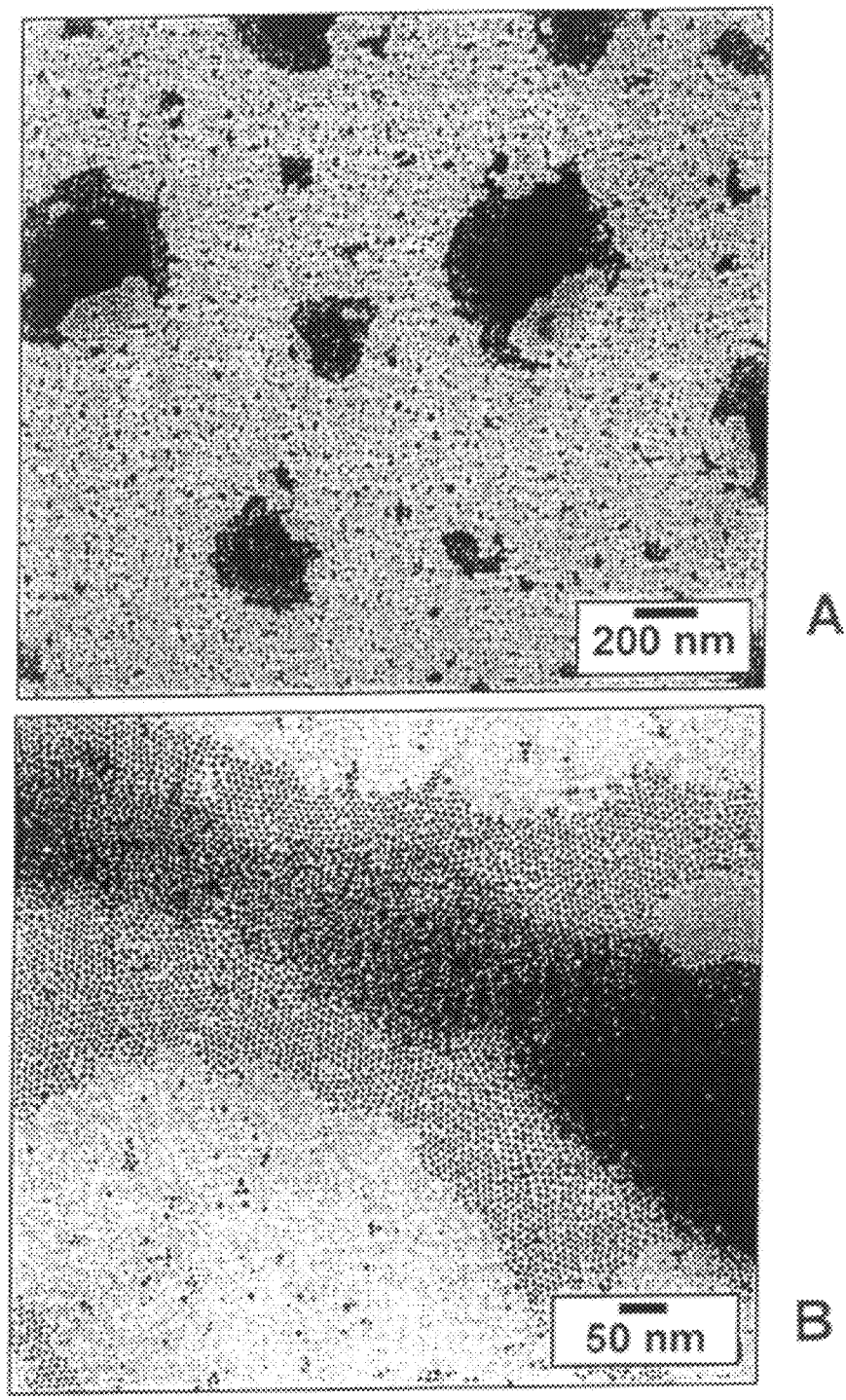
FIGS. 20A and 20B show dodecanethiol-coated silver nanoparticles deposited on a carbon grid by evaporation from hexane solvent.

Preliminary results using hexane clearly demonstrated the feasibility of this particle deposition technique and showed dramatic improvements over similar particles deposited from air-dried liquid solvents. Particles deposited by solvent evaporation are shown in FIGS. 20A and B. The figure shows dodecanethiol $(CH_3(CH_2)_{11}SH)$-coated silver particles deposited on a carbon-coated TEM grid by evaporation of the hexane solvent into air. The grid was placed in a glass tube identical to the $CO_2$ antisolvent experiments with the same concentration of nanoparticles and the same total volume of solvent. Evident on the carbon surface were local disorder, poor surface coverage, percolating networks, and islands of nanoparticles which resulted from the interfacial tensions associated with the evaporating liquid.

Deposition of Thiol-Coated Silver Nanoparticles from $CO_2$-Hexane

Figure 21:
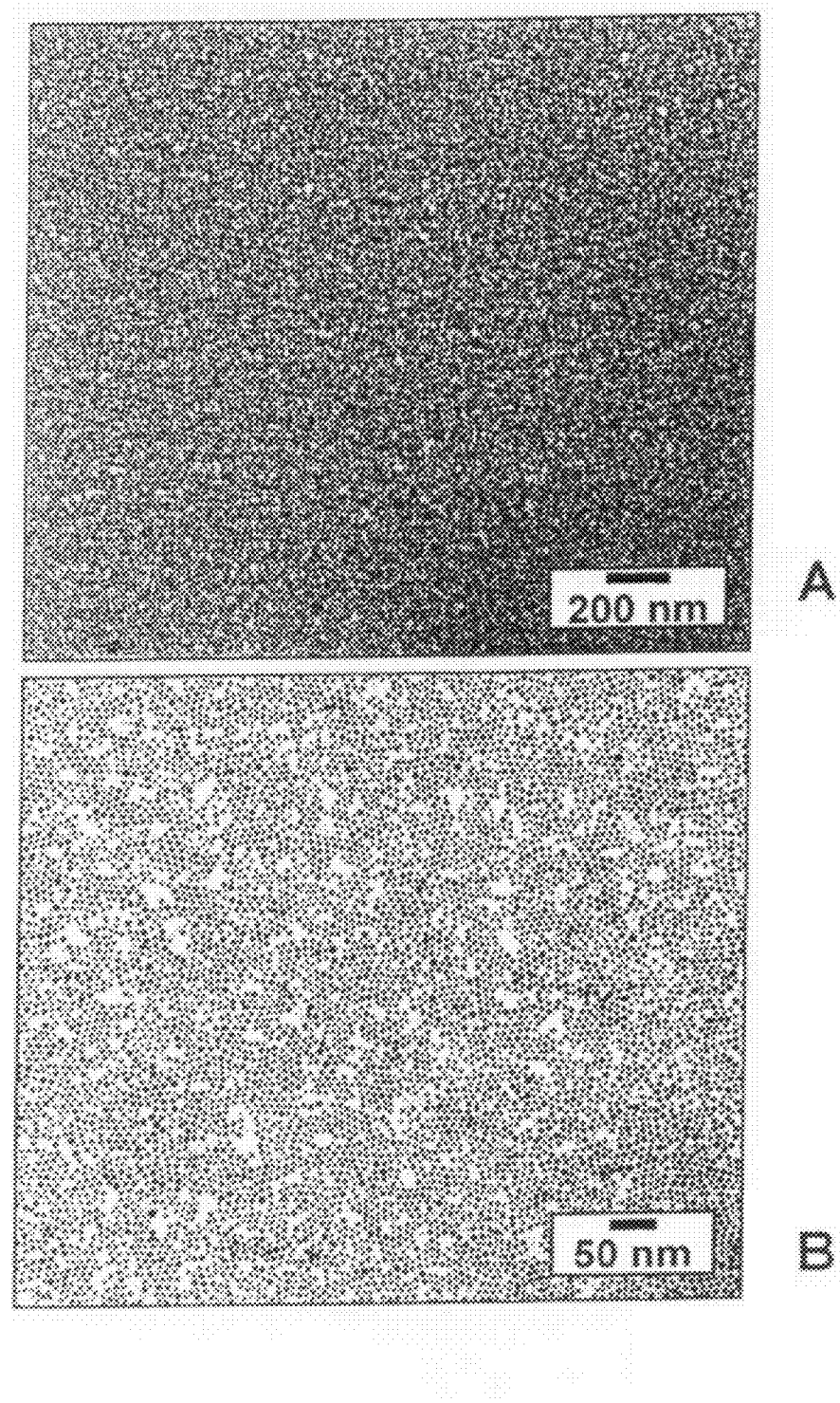
FIGS. 21 A and 21 B show dodecanethiol-coated silver nanoparticles deposited on a carbon grid by precipitation from hexane solvent after liquid expansion by $CO_2$. Deposition was performed at 25 E C with pressurization from 100 to 800 psi occurring over 1 hour.

Particles deposited by the $CO_2$ antisolvent method, on the other hand, are shown in FIGS. 21A and B. These $CO_2$-deposited particles demonstrated wide-area, closely packed films that are absent major defects resulting from interfacial tensions. The area shown in FIG. 21A consists of a region approximately 2 Fm×2 Fm. The fact that this is a wide area nanoparticle film is particularly evident when compared to the air dried particles, but the $CO_2$-deposited film actually extended over a much greater area—extending throughout the viewable region and throughout the entire TEM grid. No obstacles appeared to exist that would prevent depositing similar films over much larger areas other than the experimental apparatus.

Deposition of Lauric Acid-Coated Silver Nanoparticles from $CO_2$-Hexane

Figure 22:
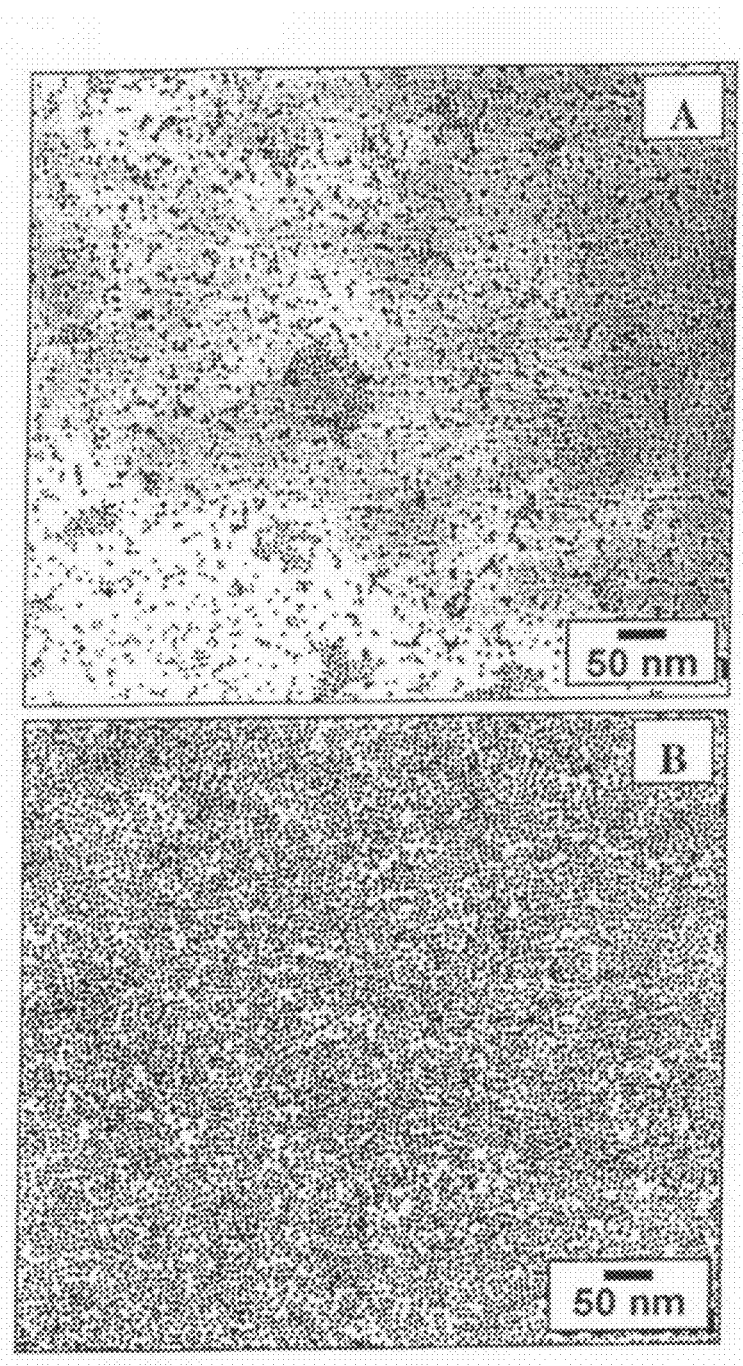
FIG. 22 shows lauric acid-coated silver nanoparticles deposited on a carbon grid by (A) evaporation of hexane solvent and (B) precipitation from hexane solvent after liquid expansion by $CO_2$ antisolvent. Pressurization from 100 to 800 psi occurred in 1 hour. Particle coverage of ca. 17% (a) as compared to 44% (b) demonstrates the more focused deposition available with $CO_2$ antisolvent precipitation.

FIG. 22 demonstrates that lauric acid ($CH_3(CH_2)_{10}COOH$)-stabilized particles can also be successfully deposited from hexane by $CO_2$ pressurization. The images show that the particles coated by lauric acid achieved similar results with even more closely packed films than when utilizing thiol-coated particles (FIGS. 21A and B). This closer packing may result from lower interparticle attraction between the smaller particles as compared to the larger thiol-coated particles. It is known that dispersed nanoparticles have inherent van der Waals attractions to each other which are proportional to their size (Hunter, R. J. *Introduction to modern colloidal science*, $1^{st}$ Ed., Oxford University Press: Oxford, New York, 1993); thus, smaller particles will settle more randomly because they are not as strongly attracted to each other in solution, thereby decreasing interparticle aggregation. This size difference is evident in FIG. 19, which revealed a mean particle size of 5.1 nm for lauric acid-coated particles and 6.8 nm for thiol-coated particles. Accordingly, the smaller average size of the lauric acid-coated particles may account for greater visible surface coverage in FIG. 22B. The larger particles utilized in the thiol experiment, on the other hand, would possess greater van der Waals attraction to each other. This would lead to tighter packing on a local scale but with small open regions from which the particles have been pulled away, as is apparent in FIG. 21B. The greater monodispersity of the lauric acid-coated particles (F=0.9 nm) as compared to the thiol-coated particles (F=1.2 nm) may also give rise to the closer particle packing as it has been shown that more monodisperse particle populations allow for greater order in nanoparticle films. Murray, C. B., Kagan, C. R., Bawendi, M. G. *Annual Rev. of Material. Sci.* 2000, 30, 545-610.

Focused Nanoparticle Deposition

FIGS. 19-23 also illustrate the greater nanoparticle deposition focus available with the $CO_2$-antisolvent deposition technique. For example, despite identical particle concentrations in FIG. 22, the air dried hexane particles showed only a 17% surface coverage as compared to 44% for the $CO_2$-deposited particles (determined using imageJ software). This arises from particle segregation to the liquid/air interface whereupon the particles are deposited from the evaporating liquid. As a result, high concentrations of particles were deposited in unintended locations. Often this means the intended location receives poor surface coverage because the majority of particles are deposited exterior to the central target. Clearly, the $CO_2$ antisolvent method provided for more focused particle deposition than is possible with an evaporating liquid.

Effect of Pressurization Rate

Figure 23:
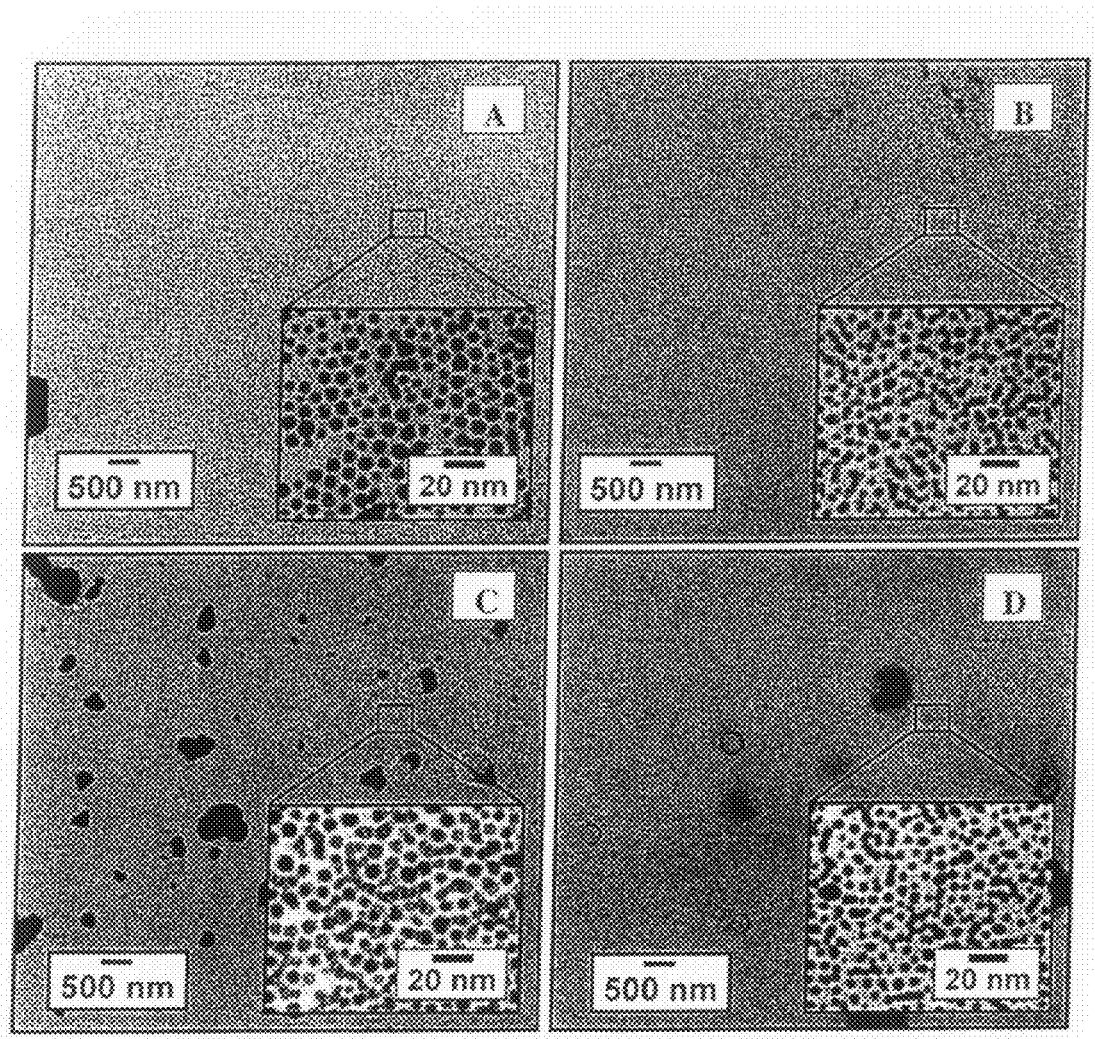
FIG. 23 shows a demonstration of the effect of $CO_2$ pressurization rate on film quality. Slow pressurization (0 to 800 psi in 5 hours) is shown for both thiol- (A) and lauric acid- (B) coated particles and fast pressurization (0 to 800 psi in 0.5 hours) is shown for both thiol- (C) and lauric acid- (D) coated particles. Slower pressurization produces higher quality nanoparticle films while faster pressurization leads to significant nanoparticle aggregation.

Preliminary investigation into the effect of $CO_2$ pressurization rate also showed that we can significantly control the nanoparticle film quality. FIG. 23 reveals that the slower pressurization rate for both dodecanethiol-capped (A) and lauric acid-capped (B) silver nanoparticles yielded more consistent, lower defect nanoparticle films. Conversely, the faster pressurization rate led to regions with locally high nanoparticle concentrations and clusters of packed nanoparticles for both thiol- (C) and lauric acid- (D) coated particles. This is attributed to the fact that slower pressurization rates allow particles to settle individually. At faster pressurization rates, the solution's ability to stabilize and disperse nanoparticles diminishes rapidly, thereby leading to clustering and aggregation of particles before settling. The large black aggregates shown on the TEM grid were observed for both slow and fast pressurization, but were significantly more numerous at faster pressurization rates. Interestingly, the aggregates were commonly observed to take the form of triangular superstructures consisting of crystalline packed nanoparticles.

Conclusions

In summary, we demonstrated an easy and effective approach to the deposition of nanoparticles which avoids the interfacial forces present at liquid/vapor interfaces. This capillary force has the tendency to pull the nanoparticles to interfacial regions when a liquid solvent is evaporating. Expanding the organic solvent with carbon dioxide and forcing the nanoparticles to precipitate provides for evenly dispersed particles over a wide area without unwanted features such as locally high concentrations and random interconnected particle networks. The use of $CO_2$ as an antisolvent provided an inexpensive, benign, non-toxic means to efficiently adjust the solvent strength of an organic solution for control of nanoparticle deposition. This method can utilize highly concentrated solutions, which, therefore, minimizes the volume of organic solvent needed. Also, given that $CO_2$ dispersibility for the particles is not necessary, there is no need for expensive and environmentally persistent fluorinated molecules that are used with $CO_2$ solvents. The method provides for much greater focus in particle deposition. We showed that these films can be tailored using different particle ligands, different sized particles, and varying pressurization rates while allowing for much greater focus in particle deposition. Furthermore, this technique provides a new tool for nanoparticle manipulation for depositing nanoparticles into areas such as high aspect ratio nanostructures and microchannels where capillary forces would otherwise make such controlled deposition impossible; application to such components are optical devices and catalyst structures.

Throughout this application, various publications are referenced. The disclosures of these publications in their entireties are hereby incorporated by reference into this application in order to more fully describe the compounds, compositions and methods described herein.

Various modifications and variations can be made to the compounds, compositions and methods described herein. Other aspects of the compounds, compositions and methods described herein will be apparent from consideration of the specification and practice of the compounds, compositions and methods disclosed herein. It is intended that the specification and examples be considered as exemplary.

What is claimed is:

1. A method comprising:
    a) loading a solution comprising dispersed nanostructures and a solvent into a vessel;
    b) adding gaseous antisolvent to the vessel containing the solution to an initial pressure, $P_0$, effective to form the solution into a gas-expanded liquid;
    c) increasing the gas pressure by pressure increment, $\Delta P_i$, to a subsequent pressure, $P_i$, at which a particular size fraction of nanostructures, $F_i$, will precipitate from the gas-expanded liquid;
    d) allowing an equilibration period, $t_i$, to precipitate the size fraction, $F_i$, of nanostructures onto a surface;

e) displacing the precipitated size fraction, $F_i$, of nanostructures from the nanostructures remaining dispersed in the gas-expanded liquid; and f) repeating steps c)-e) for i=1 to x times with the remaining solution until all desired size fractions have been precipitated and displaced wherein x=the number of size fractions of nanostructures desired.

2. The method of claim 1 where the nanostructures are ligand-coated, ligand stabilized and/or sterically stabilized.

3. The method of claim 1 further comprising collecting each displaced size fraction, $F_i$.

4. The method of claim 1 wherein the antisolvent is $CO_2$.

5. The method of claim 1 wherein the pressure increment, $\Delta P_i$, is chosen based on a desired degree of polydispersity of size for the nanostructures within the corresponding size fraction, $F_i$.

6. The method of claim 1 further comprising physically separating the displaced size fractions of nanostructures from each other.

7. The method of claim 1 wherein the solvent is organic.

8. The method of claim 1 wherein the nanostructures are thiol coated metal or semiconductor nanostructures.

9. The method of claim 1 wherein the solution is in an open-ended first vessel and the first vessel is in a second vessel.

10. The method of claim 9 further comprising allowing vapor from the solvent to saturate the second vessel before performing steps b)-f).

11. The method of claim 1 wherein the pressure increments, $\Delta P_{i=1\ to\ x}$, are each chosen to achieve a desired level of particle polydispersity for the corresponding size fraction, $F_{i=1\ to\ x}$.

12. The method of claim 1 wherein the method is for fractionating a polydisperse nanoparticle population into multiple monodisperse populations of nanostructures from a single solution and wherein $\Delta P_i$=the pressure increment corresponding with monodispersity for the solution.

13. The method of claim 1 wherein the method is for size selection of nanostructures.

14. The method of claim 1 wherein the method is for selecting mean particle size and standard deviation of nanostructures.

15. The method of claim further comprising recursive processing of at least one size fraction to further narrow the size distribution of each fraction.

16. The method of claim 1 wherein the method is for choosing the mean size of precipitated nanostructures in a nanoparticle population and wherein the mean size of precipitated nanostructures corresponds to the pressure $P_i$.

17. An improved method for size separation of nanostructures comprising:
a) expanding a solution of organic liquid and dispersed nanostructures by pressurizing with $CO_2$ over the solution in a vessel to form a gas-expanded liquid (GEL), b) providing an increased pressure, $P_i$, of $CO_2$ in the vessel to select the fraction of $CO_2$ comprising the GEL thereby tuning the solubility between the solvent strength of the solvent and the liquid $CO_2$ to precipitate the nanostructures no longer soluble in the GEL due to the change in pressure, c) separating the precipitated nanostructures from the nanostructures remaining dispersed in the gas-expanded liquid; and d) repeating steps b) to c) until all desired sizes of nanostructures are precipitated and separated.

18. The method of claim 1 wherein the dispersed nanostructures are undissolved within the solution.

19. The method of claim 1 wherein the particular size fraction of nanostructures is a fraction of an original population of nanoparticles that are within a certain size range as defined by a particle diameter.

20. A method comprising:
a) loading a colloidal dispersion comprising dispersed nanostructures and a solvent into a vessel;

b) adding gaseous antisolvent to the vessel containing the solution to an initial pressure, $P_0$, effective to form the solution into a gas-expanded liquid;

c) increasing the gas pressure by pressure increment, $\Delta P_i$, to a subsequent pressure, $P_i$, at which a particular size fraction of nanostructures, $F_i$, will precipitate from the gas-expanded liquid;

d) allowing an equilibration period, $t_i$, to precipitate the size fraction, $F_i$, of nanostructures onto a surface;

e) displacing the precipitated size fraction, $F_i$, of nanostructures from the nanostructures remaining dispersed in the gas-expanded liquid; and f) repeating steps c)-e) for i=1 to x times with the remaining solution until all desired size fractions have been precipitated and displaced wherein x=the number of size fractions of nanostructures desired.

21. An improved method for size separation of nanostructures comprising:
a) expanding a colloidal dispersion comprising organic liquid and dispersed nanostructures by pressurizing with $CO_2$ over the solution in a vessel to form a gas-expanded liquid (GEL), b) providing an increased pressure, $P_i$, of $CO_2$ in the vessel to select the fraction of $CO_2$ comprising the GEL thereby tuning the solubility between the solvent strength of the solvent and the liquid $CO_2$ to precipitate the nanostructures no longer soluble in the GEL due to the change in pressure, c) separating the precipitated nanostructures from the nanostructures remaining dispersed in the gas-expanded liquid; and d) repeating steps b) to c) until all desired sizes of nanostructures are precipitated and separated.

* * * * *

UNITED STATES PATENT AND TRADEMARK OFFICE
CERTIFICATE OF CORRECTION

PATENT NO. : 8,377,831 B2
APPLICATION NO. : 12/082189
DATED : February 19, 2013
INVENTOR(S) : Christopher B. Roberts et al.

Page 1 of 1

It is certified that error appears in the above-identified patent and that said Letters Patent is hereby corrected as shown below:

IN THE SPECIFICATION

At column 10, lines 54-56, please replace "25 E C" with -- 25°C -- so that the corresponding phrase reads -- Deposition was performed at 25°C with pressurization from 100 to 800 psi occurring over 1 hour. --.

Signed and Sealed this
Thirteenth Day of August, 2013

Teresa Stanek Rea
*Acting Director of the United States Patent and Trademark Office*